US010304656B2

(12) United States Patent
Muto et al.

(10) Patent No.: US 10,304,656 B2
(45) Date of Patent: May 28, 2019

(54) ION BEAM DEVICE

(71) Applicant: HITACHI HIGH-TECHNOLOGIES CORPORATION, Minato-ku, Tokyo (JP)

(72) Inventors: Hiroyuki Muto, Tokyo (JP); Yoshimi Kawanami, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/526,644

(22) PCT Filed: Nov. 26, 2014

(86) PCT No.: PCT/JP2014/081244
§ 371 (c)(1),
(2) Date: May 12, 2017

(87) PCT Pub. No.: WO2016/084162
PCT Pub. Date: Jun. 2, 2016

(65) Prior Publication Data
US 2017/0323764 A1    Nov. 9, 2017

(51) Int. Cl.
*H01J 37/28* (2006.01)
*H01J 37/08* (2006.01)
(Continued)

(52) U.S. Cl.
CPC ............ *H01J 37/28* (2013.01); *F25D 19/006* (2013.01); *H01J 27/022* (2013.01); *H01J 27/26* (2013.01);
(Continued)

(58) Field of Classification Search
CPC ........ H01J 37/28; H01J 37/08; H01J 37/1874; H01J 37/285; H01J 2237/002; H01J 2237/0216; H01J 2237/0807
See application file for complete search history.

(56) References Cited

U.S. PATENT DOCUMENTS 3,329,601 A * 7/1967 Mattox ................... C23C 14/32
118/723 VE
5,552,608 A * 9/1996 Gallagher ............... F17C 3/085
250/352
(Continued)

FOREIGN PATENT DOCUMENTS

WO    WO 2009/147894 A1    12/2009

*Primary Examiner* — Nicole M Ippolito
*Assistant Examiner* — Sean M Luck
(74) *Attorney, Agent, or Firm* — Miles & Stockbridge P.C.

(57) ABSTRACT

In this invention, vibrations generated by a freezer from a cooling mechanism for cooling an ion source emitter tip are prevented from being transmitted to the emitter tip as much as possible, while the cooling capability of the cooling mechanism is improved widely. The ion beam device (10) is equipped with: an ion source housing (22) provided with an emitter tip (45) and defining an ion source chamber (27) supplied with an ionization gas or gas molecules; a gas pot (51) provided in the ion source chamber (27) so as to be thermally connected to the emitter tip (45) and accommodated so as to have no direct physical contact with a cooling stage (57) of a freezer (52); and a spacer (59) provided on the peripheral surface of the cooling stage (57) housed by the gas pot (51) and maintaining a given interval or greater between the peripheral surface of the cooling stage (57) and the internal peripheral surface of the gas pot (52).

19 Claims, 15 Drawing Sheets

(51) Int. Cl.
  *H01J 37/147*  (2006.01)
  *H01J 27/26*  (2006.01)
  *F25D 19/00*  (2006.01)
  *H01J 27/02*  (2006.01)
  *H01J 37/285*  (2006.01)

(52) U.S. Cl.
  CPC .......... *H01J 37/08* (2013.01); *H01J 37/1474* (2013.01); *H01J 37/285* (2013.01); *F25B 2500/13* (2013.01); *H01J 2237/002* (2013.01); *H01J 2237/0216* (2013.01); *H01J 2237/0807* (2013.01)

(56) References Cited

U.S. PATENT DOCUMENTS

| | | | | |
|---|---|---|---|---|
| 5,816,052 A * | 10/1998 | Foote | F25D 19/006 | 62/51.1 |
| 5,821,176 A * | 10/1998 | Yeh | B32B 15/08 | 442/38 |
| 2009/0000400 A1 * | 1/2009 | Hayles | G01N 1/06 | 73/863.12 |
| 2011/0147609 A1 * | 6/2011 | Shichi | H01J 27/26 | 250/400 |
| 2011/0180213 A1 * | 7/2011 | Hirayama | H01J 37/32192 | 156/345.33 |
| 2011/0204229 A1 * | 8/2011 | Schamber | H01J 37/244 | 250/311 |
| 2012/0097863 A1 * | 4/2012 | Saho | H01J 37/08 | 250/443.1 |
| 2012/0217391 A1 * | 8/2012 | Shichi | H01J 27/26 | 250/306 |
| 2012/0241640 A1 * | 9/2012 | Ward | H01J 27/26 | 250/396 R |

* cited by examiner

ION BEAM DEVICE

TECHNICAL FIELD

The present invention relates to an ion beam device which includes an ion microscope, an ion beam, processing observation device and the like, a freezer used for cooling of an emitter tip of an ion source in the ion beam device, and a method of mounting a cooling mechanism to the ion beam device.

BACKGROUND ART

It is possible to observe a sample surface structure by scanning an electron beam and irradiating the sample with the electron beam and detecting secondary charged particles released from the sample at that time. An example of such electron beam devices is a scanning electron microscope (hereinafter, also referred to as the SEM).

Meanwhile, it is also possible to observe a sample surface structure by scanning an ion beam instead of the electron beam and irradiating the sample with the ion beam and detecting secondary charged particles released from the sample at that time. An example of such ion beam devices is a scanning ion microscope (hereinafter, also abbreviated as the SIM). In particular, when the sample is irradiated with the ion beam using ion species of a light mass, such as hydrogen and helium, in the ion beam device such as the scanning ion microscope, sputtering action relatively decreases, which is preferable to observe the sample.

A gas field ionization ion source is preferably used as an ion source of such an ion beam device. The gas field ionization ion source is the ion source that ionizes a gas using an electric field generated by an emitter tip and generates an ion beam. The gas field ionization ion source is configured to include a gas ionization chamber containing the emitter tip which has a needle shape and to which a high voltage can be applied, and an ionization gas (ion material gas) is supplied to the gas ionization chamber from the gas source via a gas supply piping.

In the gas field ionization ion source, when the ionization gases (or gas molecules) supplied from the gas supply piping approaches a distal end of the needle-shaped emitter tip to which the high voltage is applied and an intense electric field is applied, electrons inside the gases (gas molecules) tunnel through a potential barrier, which has been reduced by the intense electric field, due to a quantum tunneling effect, and the gases (gas molecules) are released as positive ions. These released ions are used as the ion beam in the ion beam device.

The gas field ionization ion source can generate an ion beam having a narrow energy width. In addition, a size of the ion generation source is small, and thus, it is possible to generate a fine ion beam.

Meanwhile, it is necessary to obtain an ion beam, with a high current density on a sample in order to observe the sample at a high signal to noise ratio (S/N ratio) in the ion beam device including the scanning ion microscope. In order for this, it is necessary to increase an ion radiation angle current density of the gas field ionization ion source. A molecular density of the ionization gas in the vicinity of the emitter tip may be increased in order to increase the ion radiation angle current density.

In this case, a gas molecular density per unit pressure is inversely proportional to temperature of the gas. In this regard, it is desirable to cool the emitter tip to cryogenic temperature and decrease the temperature of the ionization gas in the vicinity of the emitter tip. Accordingly, it is possible to increase the molecular density of the ionization gas in the vicinity of the emitter tip by cooling the emitter tip to the cryogenic temperature.

On the other hand, it is necessary to prevent vibration of a freezer, which is an ion beam device cooling mechanism that cools the emitter tip to the cryogenic temperature, from being transmitted to the emitter tip in order to observe the sample with high resolution in the ion beam, device including the scanning ion microscope. Thus, PTL 1 discloses an ion beam device cooling mechanism provided with a function of preventing transmission of vibration caused by a refrigerator to an emitter tip of a gas field ionization ion source, the ion beam device cooling mechanism in which the mechanical refrigerator and a helium gas pot are combined. A helium gas (inert gas) is stored in the helium gas pot as a cooling medium gas for cooling of the gas field ionization ion source.

CITATION LIST

Patent Literature

PTL 1: WO 2009/147894

SUMMARY OF INVENTION

Technical Problem

The inventor of the present application has conducted extensive studies on an ion beam device which is provided with an ion beam device cooling mechanism so as to cool an emitter tip to cryogenic temperature and to prevent vibration caused by a freezer from being transmitted to the emitter tip, and as a result, has obtained the following findings.

In the ion beam device cooling mechanism disclosed in PTL 1, a gas pot that transmits coldness to the emitter tip and a cooling stage of the refrigerator are likely to have direct physical contact with each other at the time of assembling a vacuum chamber of a device main body and the refrigerator. Thus, when the gas pot and the cooling stage of the refrigerator are brought into direct physical contact with each other, vibration of a main body of the refrigerator is also transmitted to the gas pot. In general, the gas pot is fixed to the vacuum chamber defining a gas ionization chamber of the ion beam device rigidly, that is, mechanically firmly so that a positional relationship thereof is not deviated. Thus, when the gas pot vibrates, the vacuum, chamber of the ion beam device also vibrates in response thereto. In addition, the vacuum chamber and the emitter tip of the gas field ionization ion source are also rigidly fixed to each other, and thus, the emitter tip also vibrates when the vacuum chamber vibrates. As a result, the emitter tip vibrates, it is difficult for a released ion beam to be sufficiently converged, and it is difficult to perform high-resolution observation.

In order to prevent this problem, it is necessary to make a gap (interval) between the gas pot and the cooling stage of the refrigerator wide such that the pot and the cooling stage have no direct physical contact with each other. However, the gas pot is not sufficiently cooled by the cooling stage when the gap between the gas pot and the cooling stage is made wide.

Meanwhile, the gas pot and the emitter tip are thermally connected to each other, and thus, the emitter tip is not sufficiently cooled when the gas pot is not sufficiently cooled. When the emitter tip is not sufficiently cooled, it is difficult to lower the temperature of the ionization gas in the vicinity of the emitter tip to be the cryogenic temperature. Further, when it is difficult to lower the temperature of the ionization gas in the vicinity of the emitter tip to be the cryogenic temperature, the molecular density of the ionization gas in the vicinity of the emitter tip decreases. As a result, it is difficult to increase the ion radiation angle current density, and it is difficult to obtain the ion beam with a high current density on the sample. Thus, it is difficult to observe the sample at the high signal to noise ratio in the ion beam device such as the scanning ion microscope.

The present invention has solved the various problems in the conventional ion beam device based on the above-described findings acquired regarding the ion beam device cooling mechanism, and an object thereof is to provide an ion beam, device which prevents vibration caused by a freezer in an ion beam device cooling mechanism from being transmitted to an ion source as much as possible and enables significant improvement in cooling performance of the ion beam device cooling mechanism.

Solution to Problem

An ion beam device according to the present invention includes: an ion source housing that is provided with an emitter tip to generate an ion and defines an ion source chamber supplied with an ionization gas or gas molecules; a cooling pot that is provided in the ion source chamber so as to be thermally connected to the emitter tip and contains a cooling stage of a freezer so as to have no direct physical contact therebetween; and a spacer that maintains a given interval or greater between a peripheral surface of the cooling stage and an internal peripheral surface of the cooling pot.

In addition, a freezer used in an ion beam device according to the present invention includes: a cooling stage that is contained in a cooling pot, which is provided in an ion source chamber so as to be thermally connected to an emitter tip, so as to have no direct physical contact with the cooling pot and cools the cooling pot via a heat conducting medium; and a spacer that maintains a given interval or greater between a peripheral surface of the cooling stage and an internal peripheral surface of the cooling pot.

In addition, a method of mounting a cooling mechanism to an ion beam device according to the present invention includes: containing a cooling stage to cool a cooling pot in the cooling pot which is provided in an ion source chamber so as to be thermally connected to an emitter tip maintaining a spacer in a normal temperature state, the spacer configured using a material whose volume shrinks in a cooling state with respect to the normal temperature state; and causing the spacer to be in the cooling state in a state of being contained in the cooling pot so as to separate a peripheral surface of the spacer and an internal peripheral surface of the cooling pot.

Advantageous Effects of Invention

According to the present invention, it is possible to set a gap between a gas pot and the cooling stage to be narrow without causing the direct physical contact between the gas pot as the cooling pot and the cooling stage of the freezer, and to hold positioning of the gas pot with respect to the cooling stage. Thus, it is possible to reduce transmission of vibration from the cooling stage to the emitter tip via the gas pot as much as possible, to favorably perform cooling of the gas pot using the cooling stage, and to improve cooling performance in the emitter tip and in the vicinity of the emitter tip.

Accordingly, it is possible to obtain the following effects as the ion beam device.

(1) It is possible to perform higher-sensitivity inspection of a sample using the ion beam device.

(2) It is possible to improve detection reproducibility of a defect in inspection results.

Incidentally, other objects, configurations, and effects will be apparent from the following description of embodiments.

BRIEF DESCRIPTION OF DRAWINGS

FIGS. 13(a) and 13 (b) are views for comparison between a normal temperature state and a cooling state in the cooling stage unit and the gas pot section illustrated in FIG. 11.

DESCRIPTION OF EMBODIMENTS

Figure 1:
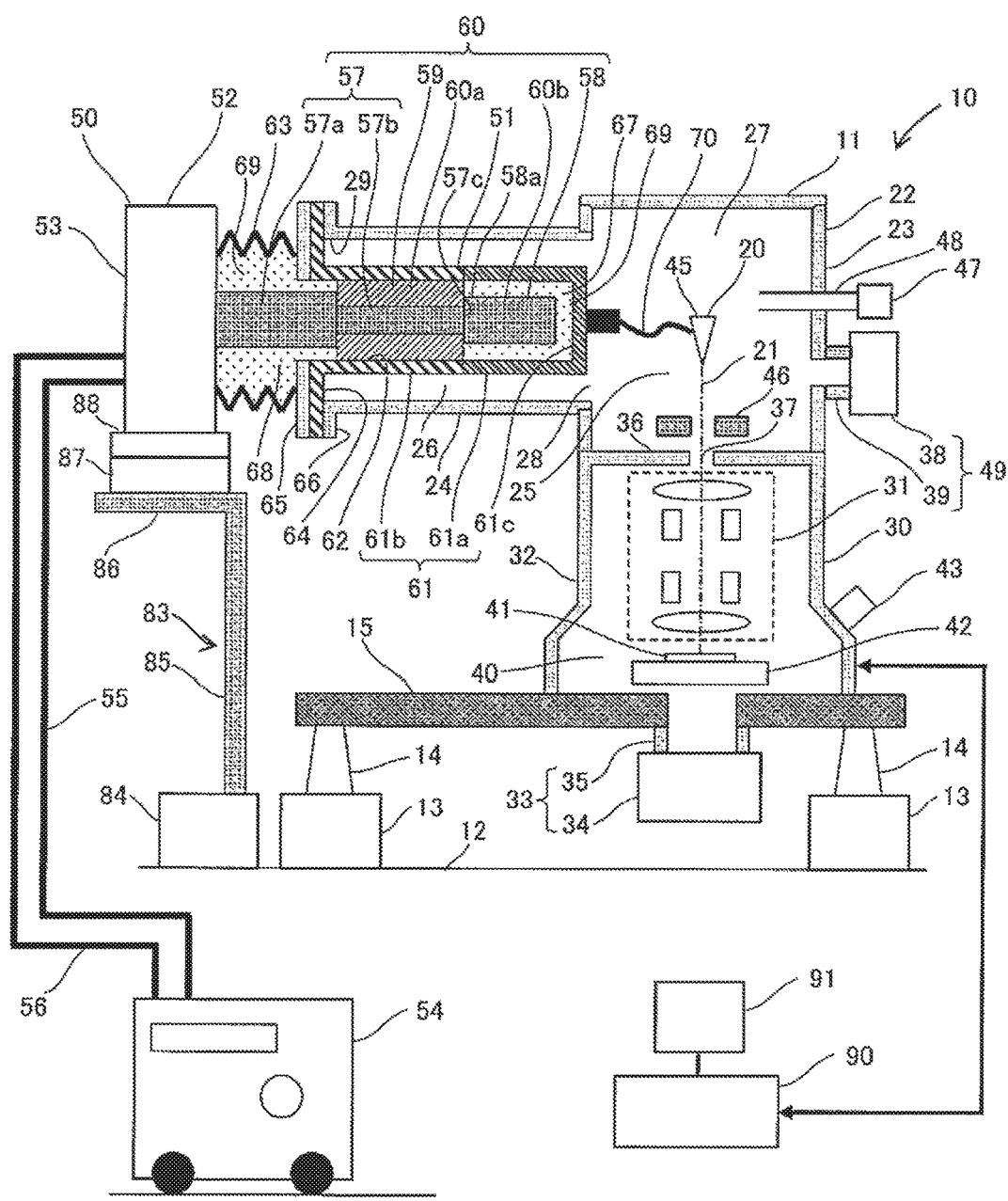
FIG. 1 is a schematic configuration diagram of a scanning ion microscope as an ion beam device according to a first embodiment of the present invention.

First, characteristics of an ion beam device will be described before describing embodiments of the present invention.

The ion beam device is sensitive to information on a sample surface as compared to an electron beam device using an electron beam such as an SEM. This is because an excitation region of secondary charged particles is localized by the sample surface in irradiation with an ion beam, as compared to irradiation with the electron beam. In addition, a diffraction effect of the ion beam can be ignored in the ion beam device. Aberration is generated due to the diffraction effect in the electron beam because it is difficult to ignore a property of the electron as a wave. On the contrary, the property as the wave can be ignored in the ion beam since ions have a heavier mass than electrons.

An example of the ion beam device taking advantage of such a characteristic is a scanning ion microscope. The scanning ion microscope is a device that observes a surface structure of a sample by scanning an ion beam and irradiating the sample with the ion beam, and detecting secondary charged particles released from the sample. In particular, when the sample is irradiated with ion species of a light mass, such as hydrogen and helium, sputtering action relatively decreases, which is preferable to observe the sample.

In addition, another example of the ion beam device is a transmission ion microscope. The transmission ion microscope is a device that is capable of obtaining information reflecting an internal structure of a sample by irradiating the sample with an ion beam and detecting ions transmitted through the sample. The transmission ion microscope is preferable to observe the sample as a proportion of the ions transmitting through the sample becomes large if the sample is irradiated with ion species with a light mass, such as hydrogen and helium.

In addition, still another example of the ion beam device is a focused ion beam device (hereinafter, also abbreviated as the FIB). The focused ion beam device is a device that processes a sample using sputtering action by irradiating the sample with ion species with a heavy mass, conversely, such, as argon, xenon, and gallium which are preferable to process the sample using the sputtering action. In particular, a focused ion beam device (FIB) that uses a liquid metal ion source (hereinafter, also abbreviated as the LMIS) as an ion source to generate an ion beam is known as a focused ion beam processing observation device.

In addition, an FIB-SEM device, which is a device obtained by combining the scanning electron microscope (SEM) and the focused ion beam device (FIB), has been also used in recent years. The FIB-SEM device can form a square hole at a desired point in a sample by irradiating the sample with a focused ion beam (FIB), and perform SEM observation of a cross-section of the sample. In the FIB-SEM device, an ion source is not limited to the liquid metal ion source, and the sample can be processed even by generating a gas ion, such as argon and xenon, and irradiating the sample with the generated gas ion using a plasma ion source or a gas field ionization ion source as the ion source.

The present invention can be applied in ion beam devices such as the ion microscopes and the ion beam processing observation device described above, and an ion beam device in which the ion beam, devices are combined, such as the device obtained by combining the ion beam processing observation device and the ion microscope. In addition, the present invention can be also applied to ion beam devices in which an ion beam device and a device other than the ion beam device are combined such as an analysis and inspection device obtained by applying an ion microscope and an electron microscope, a device obtained by combining an ion microscope and amass spectrometer, and a device obtained by combining an ion microscope, an electron microscope, and a mass spectrometer.

Hereinafter, the ion beam device in which the ion beam devices are combined, and the ion beam devices in which the ion beam device and the devices other than the ion beam device are combined are also collectively referred to as the ion beam device. Accordingly, the ion beam device according to the present invention is not limited to the above-described devices as long as the ion beam device is a device using an ion source, and particularly, a device using a gas field ionization ion source.

Hereinafter, a description will be given by exemplifying a scanning ion microscope, which is a kind of ion beam devices, regarding embodiments of the ion beam device according to the present invention, a freezer used in the ion beam device, and a method of mounting a cooling mechanism to the ion beam device, with reference to drawings. Incidentally, the drawings are used solely for understanding of the present invention, and do not limit specific configurations of the ion beam device according to the present invention, the cooling mechanism of the device, and the like, or kinds of the ion beam device, and do not uselessly restrict the scope of the claims.

<First Embodiment>

FIG. 1 is a schematic configuration diagram of a scanning ion microscope as an ion beam device according to a first embodiment of the present invention.

Figure 2:
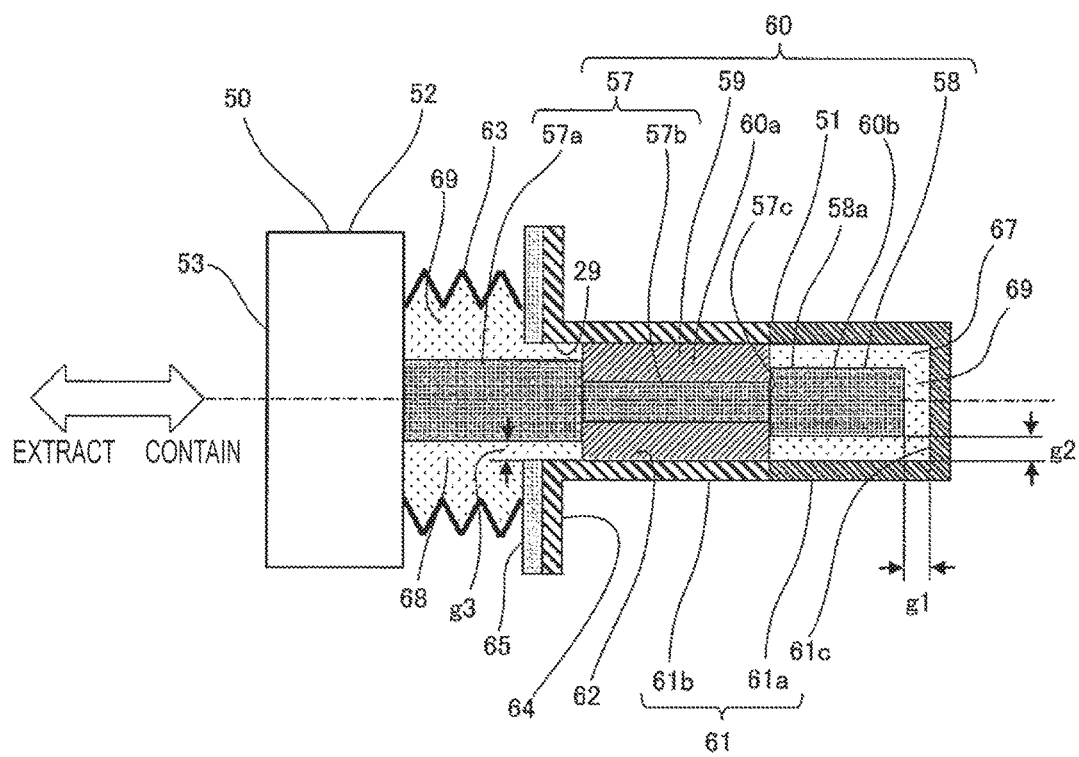
FIG. 2 is a partially enlarged view of a cooling stage unit and a gas pot section forming an ion beam device cooling mechanism of the scanning ion microscope illustrated in FIG. 1.

FIG. 2 is a partially enlarged view of a cooling stage unit and a gas pot section forming an ion beam device cooling mechanism of the scanning ion microscope illustrated in FIG. 1.

Figure 3:
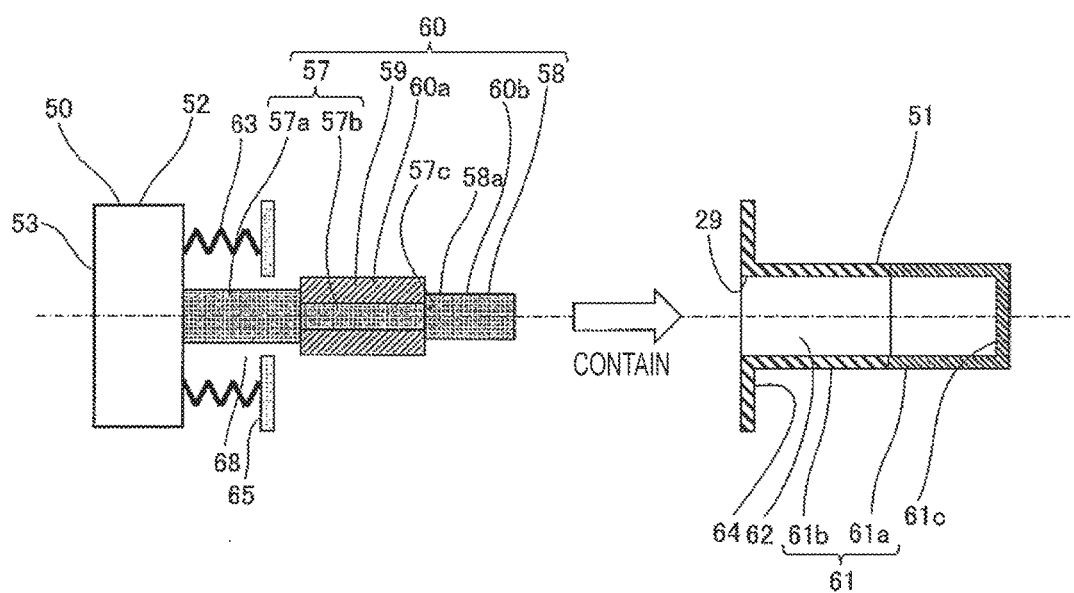
FIG. 3 is a diagram illustrating the cooling stage unit section and the gas pot section which are separated before being assembled as the cooling stage unit and gas pot section illustrated in FIG. 2.

FIG. 3 is a diagram illustrating the cooling stage unit section and the gas pot section which are separated before being assembled as the cooling stage unit and the gas pot section illustrated in FIG. 2.

Figure 4:
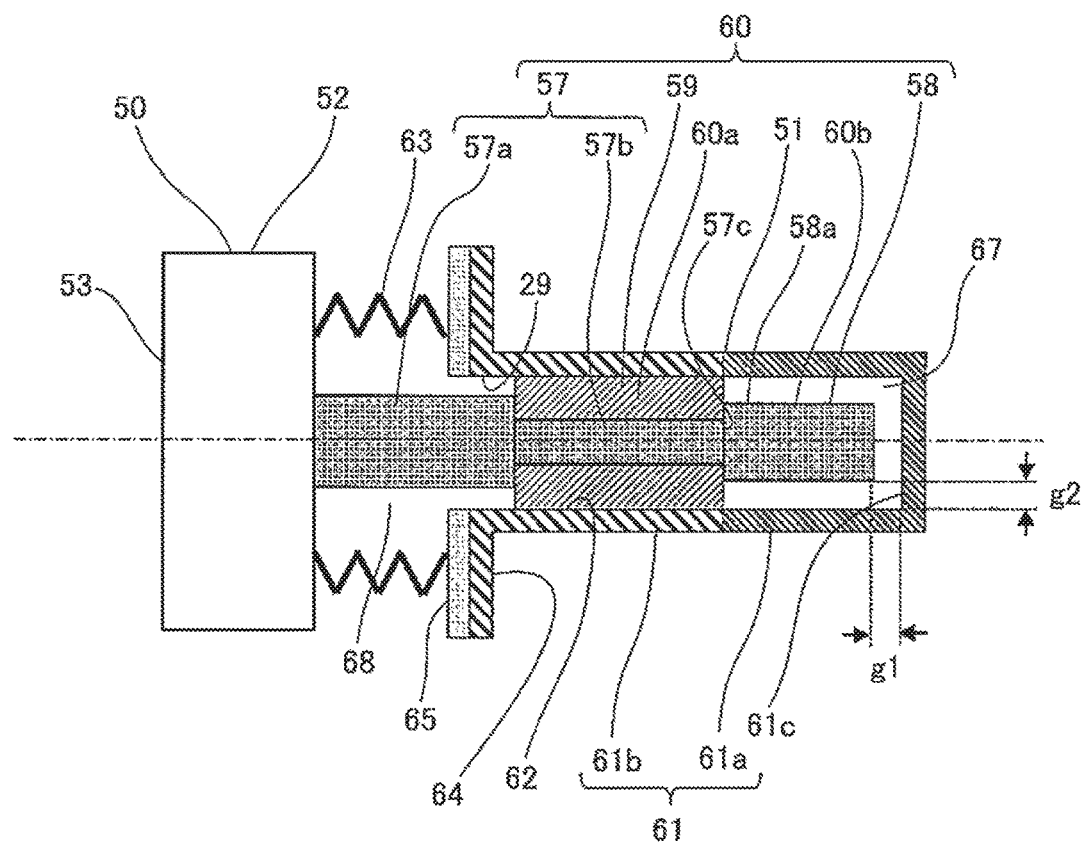
FIG. 4 is a diagram in which the cooling stage unit section and the gas pot section illustrated in FIG. 3 are assembled.

FIG. 4 is a diagram in which the cooling stage unit section and the gas pot section illustrated in FIG. 3 are assembled.

As illustrated in the drawing, a scanning ion microscope 10 as the ion beam device includes an ion source 20 to generate an ion beam 21, a column (lens barrel) 30 provided with a beam irradiation system 31, a sample chamber 40 in which a sample 41 as an observation target is contained and arranged, an ion beam device cooling mechanism 50 (hereinafter, also abbreviated as the cooling mechanism 50) to cool the ion source 20, and a control device 90 to perform control of each unit of the microscope.

In the illustrated example, the sample chamber 40 and the column 30 are configured to be integrated by a vacuum chamber 32. Furthermore, the vacuum chamber 32 also serving as a sample chamber housing and the column forms a device main body 11 of the ion beam, device 10 together with an ion source housing 22 of the ion source 20. The vacuum chamber 32, that is, the device main body 11 of the ion beam, device 10 is mounted and fixed to a base plate 15 that is supported by a base stand 13, arranged on a floor 12, with an anti-vibration mechanism 14 interposed therebetween.

The anti-vibration mechanism 14 is configured using, for example, anti-vibration rubber, a spring, a damper, or combinations thereof. The anti-vibration mechanism 14 attenuates vibration transmitted from the floor 12 to the base plate 15 via the base stand 13. Accordingly, the vibration transmitted from the floor 12 to the device main body 11 is reduced to a level that does not cause a problem in practical use of the scanning ion microscope 10.

The vacuum chamber 32 includes the sample chamber 40 and the column 30 in an internal portion thereof, and the internal portion of the chamber is held in vacuum. In order for this, the vacuum chamber 32 is connected with a vacuum exhaust system 33 for vacuum exhaust of atmosphere inside the chamber. In the illustrated example, the vacuum exhaust system 33 is configured such that a vacuum exhaust equipment 34, such as a vacuum pump, is connected to an exhaust port of the vacuum chamber 32 formed in the base plate 15 via a vacuum exhaust pipe 35. In this case, the vacuum exhaust system 33 is also provided with an anti-vibration mechanism (not illustrated), for example, at an intermediate portion of the vacuum exhaust pipe 35 or a connection portion with the vacuum exhaust equipment 34 or the base plate 15 using, for example, a damping member such as bellows, packing, and a seal. Accordingly, driving vibration of the vacuum exhaust equipment 34 to be transmitted to the base plate 15 and the device main body 11 via the vacuum exhaust pipe 35 is also reduced to a level that does not cause a problem, in practical use of the scanning ion microscope 10.

In the illustrated example, it is configured such that the sample chamber 40 and the column 30 to store the beam irradiation system 31 are vertically arranged in an integrated manner in a plate thickness direction of the base plate 15 inside the vacuum chamber 32.

The sample chamber 40 is provided with a sample stage 42 on which a sample 41 is placed to be moved inside the sample chamber 40, and a secondary particle detector 43 that detects a secondary particle generated from the sample 41 due to the irradiation with the ion beam 21. In addition, a sample loading and unloading port (not illustrated) is formed in a peripheral wall of the sample chamber section of the vacuum chamber 32. The sample loading and unloading port is usually sealed in an airtight manner by a lid that can block or open the port. The sample 41 as the observation target is loaded to or unloaded from the sample chamber 40 through the sample loading and unloading port.

The sample stage 42 includes a mounting surface to which the loaded sample 41 is mounted and a drive mechanism that causes movement (also including rotating and inclination) of the mounting surface. The sample stage 42 displaces an ion beam irradiation position and changes an irradiation direction on the mounted sample 41 in response to the movement of the mounting surface. The secondary particle detector 43 detects the secondary particle generated from the sample 41 due to the irradiation with the ion beam 21, and outputs a signal of the detection to an image generation unit inside the control device 90.

The beam irradiation system 31 is configured to include a lens that focuses and scans the ion beam 21 released from the ion source 20, a deflector, and the like. In the illustrated example, the beam irradiation system 31 is fixedly arranged inside the vacuum chamber 32 above the sample chamber 40, that is, in the column 30 such that an optical axis thereof extends in the plate thickness direction of the base plate 15 which is vertical to the plate surface of the base plate 15. The beam irradiation system 31 drives and controls each unit of the lens, the deflector, and the like based on a control signal supplied from an irradiation control unit inside the control device 90 such that a desired position on a surface of the sample mounted to the sample stage 42 is irradiated with the ion beam 21 generated by the ion source 20.

Meanwhile, a gas field ionization ion source (hereinafter, also abbreviated as the gas ion source) is used as the ion source 20 to generate the ion beam 21 in the present embodiment. The gas ion source 20 has a configuration in which the ion source housing 22 thereof is integrally fixed to the vacuum chamber 32 such that an optical axis of the ion beam 21 to be generated becomes coaxial with the optical axis of the beam irradiation system 31. In the illustrated example, the ion source housing 22 includes an ion source containing housing portion 23 that is continuously provided at an upper part of the vacuum chamber 32, and a pot containing housing portion (cooling mechanism housing portion) 24 that projects outwardly in a horizontal direction from a side surface of the ion source containing housing portion 23 to be parallel with the plate surface of the base plate 15. Accordingly, a gas ionization chamber 25 is formed inside the ion source containing housing portion 23, and a pot containing chamber 26 is formed inside the pot containing housing portion 24. The two chambers 25 and 26 usually communicate with each other via a communication port 28 in a connecting portion between the ion source containing housing portion 23 and the pot containing housing portion 24, and an integrated ion source chamber 27 is configured by combining both the chambers 25 and 26. In addition, a projecting end of the pot containing housing portion 24 is opened toward the horizontal direction as a cooling mechanism mounting port 29. The ion source chamber 27 and the inside of the column 30 of the vacuum chamber 32 are connected only via a passage hole 37 formed at a bulkhead 36 that defines the two chambers. The passage hole 37 is formed on the bulkhead 36 to penetrate therethrough in accordance with a position of the optical axis of the beam irradiation system 31.

Incidentally, the description has been given in the present embodiment regarding the configuration in which an extending direction of the pot containing chamber 26 in the pot containing housing portion 24 and an opening direction of the cooling mechanism mounting port 29 are the horizontal direction, the extending direction and the opening direction are not necessarily limited to the horizontal direction. For example, both the directions may be configured to be the vertical direction.

The gas ion source 20 includes an emitter tip 45 and an extraction electrode 46 in the gas ionization chamber 25 of the ion source housing 22. A gas supply piping 48 to supply an ionization gas from a gas source 47 and a vacuum, exhaust pipe 39 of a vacuum exhaust system 49 for vacuum exhaust of atmosphere inside the ion source chamber 27 are configured to be connected to the gas ionization chamber 25 in a communicating manner.

The emitter tip 45 is configured using a needle-shaped electrode to which a high voltage can be applied. The emitter tip 45 is connected to a gas ion source control unit inside the control device 90 such that the high voltage is applied by the control of the gas ion source control unit, and an intense electric field, can be generated from the needle-shaped electrode. The emitter tip 45 generates positive ions as electrons inside the gas molecules tunnel a potential barrier reduced by the intense electric field from the needle-shaped electrode of the emitter tip 45 due to a quantum tunneling effect when the gas molecules of the ionization gas approaches. The extraction electrode 46 is connected to the gas ion source control unit inside the control device 90, and extracts the positive ions generated by the emitter tip 45 so as to be released as the ion beam when being applied with an extraction voltage by control of the gas ion source control unit. The emitter tip 45 and the extraction electrode 46 are fixedly arranged in the ion source containing housing portion 23 such that the optical axis of the ion beam 21 to be released becomes coaxial with the passage hole 37 of the bulkhead 36 and the optical axis of the beam irradiation system 31. Incidentally, the ionization gas supplied to the ion source chamber 27 passing through the gas supply piping 48 may be the gas molecules.

An anti-vibration mechanism using a damping member, such as bellows, packing, and a seal, is also provided in the middle of the gas supply piping 48, a connection portion thereof, and the like. Accordingly, driving vibration of the gas source 47 of the ionization gas to be transmitted to the ion source housing 22 via the gas supply piping 48 is also reduced to a level that does not cause a problem in practical use of the scanning ion microscope 11. Similarly, an anti-vibration mechanism using a damping member, such as bellows, packing, and a seal, is also provided in the middle of the vacuum exhaust pipe 39, a connection portion thereof, and the like. Accordingly, driving vibration of a vacuum exhaust equipment 38 to be transmitted to the ion source housing 22 via the vacuum exhaust pipe 39 is also reduced to a level that does not cause a problem, in practical use of the scanning ion microscope 11. Incidentally, the vacuum exhaust equipment 39 that performs the vacuum exhaust inside the ion source chamber 27 can be shared with the vacuum exhaust equipment 34 that performs the exhaust of the vacuum chamber 32.

The ion beam 21 generated by the emitter tip 45 of the gas ion source 20 and released from the extraction electrode 46 enters the inside of the vacuum chamber 32 via the passage hole 37, is appropriately focused, deflected or scanned by the beam irradiation system 31, and causes an observation point on the sample 40 mounted to the sample stage 42 inside the sample chamber 40 to be irradiated therewith. At this time, secondary charged particles released from the observation point on the sample 40 due to the irradiation with the ion beam 21 are detected by the secondary particle detector 43, and an observation image of an irradiation point of the ion beam is generated based on the detection signal from the secondary particle detector 43 in the image generation unit inside the control device 90. The control device 90 causes this generated observation image to be displayed on a display unit of an input/output device 91 so as to be visually confirmed.

Meanwhile, a gas pot 51 of the cooling mechanism (ion beam device cooling mechanism) 50 is contained and arranged in the pot containing chamber 26 of the ion source chamber 27. Before describing the arrangement of the gas pot 51 contained in the pot containing chamber 26, first, a description will be given regarding the entire configuration of the cooling mechanism 50 included in the scanning ion microscope 10 according to the present embodiment.

The cooling mechanism 50 cools the emitter tip 45 to cryogenic temperature in order to increase a molecular density of an ionization gas in the gas ionization chamber 25 section around the emitter tip 45, and lowers temperature of an ionization gas around the emitter tip 45. The cooling mechanism 50 is configured using a cooling mechanism in which a mechanical freezer 52 and the gas pot 51 are combined.

In the present embodiment, a Gifford-McMahon cooler (GM cooler) is used as the mechanical freezer 52 of the cooling mechanism 50. Incidentally, a pulse tube freezer, a Stirling freezer or the like may be also used as the mechanical freezer 52 without being limited to the GM cooler.

The freezer 52 includes a freezer main body 53 and a compressor 54, and the freezer main body 53 and the compressor 54 are connected to each other via a high-pressure piping 55 and a low-pressure piping 56. The freezer 52 has a structure in which coldness is generated by periodically expanding a high-pressure working gas inside the freezer main body 53.

The compressor 54 compresses the working gas made of, for example, a helium, gas to a high-pressure state, and supplies the compressed gas to the freezer main body 53 via the high-pressure piping 55. The working gas with lowered pressure after being used to generate the coldness in the freezer main body 53 is collected by the compressor 54 via the low-pressure piping 56. The collected working gas is compressed again by the compressor 54.

For example, the freezer main body 53 includes a cylinder (not illustrated) provided with a displacer, which is integrated with a built-in coldness accumulator, so as to be reciprocatingly movable, a displacer driving means (not illustrated) that causes the displacer to reciprocate in the cylinder, and a valve mechanism which causes the inside of the cylinder to communicate with the high-pressure piping 55 or the low-pressure piping 56 in accordance with the movement of the displacer inside the cylinder so as to cause the working gas to flow in and out. Further, it is configured such that a section including an expansion chamber side inside the cylinder defined by the displacer projects from a housing surface thereof in a rod shape as a cooling stage 57 to cool a thermal load.

In the illustrated example, the cooling stage 57 has a stepped rod shape in which a stage 57b whose outer shape viewed in an axis direction is formed to be smaller than an outer shape of a base 57a is formed to be coaxial and projects from the base 57a formed to project on a housing surface of the freezer main body 53. A stage distal end side of the cooling stage 57 is a most cooling face, and thus, a base 58a of a fin 58 is tightly fixed to the cooling stage 57 in a coaxial manner at a stage distal end 57c. The fin 58 is formed using a material having a high heat conducting property (heat dissipation property), for example, oxygen-free copper, to achieve enlargement of the area of the most cooling face of the cooling stage 57. Along with this, an outer shape of the fin 58 vertical to the axis direction, which is viewed in the axis direction of the cooling stage 57, is larger than the outer shape of the stage 57b of the cooling stage 57 so as to have a large diameter.

In addition, a spacer 59 is attached to a peripheral surface of the stage 57b of the cooling stage 57 so as to surround the peripheral surface of the stage 57b. The spacer 59 is formed to have an external peripheral edge projecting outwardly in a radial direction than an external peripheral edge of the fin 58, in relation to the radial direction having the axis of the cooling stage 57 as the center, in the state of being mounted to the stage 57b.

Incidentally, it is possible to use various specific forms, for example, a tubular spacer that surrounds the entire peripheral surface of the stage 57b of the cooling stage 57, a spacer piece assembly obtained by arranging a plurality of spacer pieces side by side with a predetermined interval along a circumferential direction of the stage 57b so as to partially surround the peripheral surface of the stage 57b, and the like, as a specific form of the spacer 59 based on the above-described viewpoint.

In addition, it is possible to use various shapes of the external peripheral edge, for example, a circular shape of the external peripheral edge projecting at least with respect to the external peripheral edge of the fin 58 in an entire region along the circumference thereof, a polygonal shape in which corners of the external peripheral edge project at least with respect to the external peripheral edge of the fin 58 partially only at a plurality of points along the circumference thereof, even in the case where the spacer 59 is the tubular spacer, for example, in relation to the shape of the external peripheral edge obtained by viewing the spacer 59 in the state of being mounted to the stage 57b of the cooling stage 57 in the axis direction thereof.

In the present embodiment, it is assumed to use the tubular spacer, which surrounds the entire peripheral surface of the stage 57b in the state of being mounted to the stage 57b of the cooling stage 57, and has the external peripheral edge projecting outwardly in the radial direction more than each external peripheral edge of the base 57a and the fin 58 over the entire region along the circumference thereof, as the spacer 59. Hereinafter, the cooling stage 57 in the state of being assembled with the fin 58 and the spacer 59 will be referred to as a cooling stage unit 60.

Further, in the present embodiment, the spacer 59 has a heat insulating property and further, has temperature reversibility in terms of its size so that spacer 59 contracts and the volume thereof decreases as compared to a normal temperature state when being cooled from normal temperature (for example, corresponding to room temperature of a room in which the scanning ion microscope 10 is provided), and returns to substantially the same size when returning to the normal temperature. Thus, the spacer 59 has the temperature reversibility in terms of a size of the external peripheral edge viewed in the axis direction thereof so that the external peripheral edge contracts as compared to the normal temperature state when being cooled and returns to the original size when returning to the normal temperature. The above-described spacer 59 is configured using a porous material, for example foamed resin.

A peripheral surface of a spacer mounting portion 60a of the cooling stage unit 60 is configured to project outwardly in a radial direction in the entire region along the circumference thereof more than a peripheral surface of a fin portion 60b of the cooling stage unit 60 at the normal temperature, in relation to the radial direction having an axis of the cooling stage unit 60 as the center.

Meanwhile, the gas pot 51 includes a pot main body 61 having a bottomed-cylindrical shape whose one end is blocked and the other end is opened, and has a structure such that a stage containing chamber 62, which can contain the fin 58 of the cooling stage unit 60 and the stage 57b of the cooling stage 57 provided with the spacer 59, is included in the pot main body 61. In the present embodiment, a length in an axial direction of the stage containing chamber 62 is set to be appropriately longer than a length obtained by adding a length of an axial direction of the spacer mounting portion 60a in the cooling stage unit 60 (length in an axial direction of the stage 57b of the cooling stage 57 mounting the spacer 59) and a length in an axial direction of the fin portion 60b (length in an axial direction of the fin 58 that is tightly fixed to the stage 57b of the cooling stage 57). Accordingly, it is configured such that it is possible to form an end face gap g1 (see FIG. 2) between a distal end portion of the fin 58 in the axial direction and a containing chamber bottom 61c of the pot main body 61 in a state where the cooling stage unit 60 is contained in the stage containing chamber 62.

Incidentally, it is configured such that a part of the base 57a, formed to project on the housing surface of the freezer main body 53, is also contained in the stage containing chamber 62 of the pot main body 61 in the illustrated example. Thus, an outer shape of the spacer mounting portion 60a vertical to the axial direction viewed in the axis direction of the cooling stage unit 60 is larger than an outer shape of the base 57a vertical to the axis direction, and an external peripheral edge of the spacer mounting portion 60a projects outwardly in the radial direction more than the external peripheral edge of the base 57a in the entire region along the circumference thereof. However, when the base 57a formed to project on the housing surface of the freezer main body 53 is not contained in the stage containing chamber 62 of the pot main body 61 at all, the base 57a is hardly brought into contact with an internal peripheral surface of the pot main body 61 serving as a wall surface of the stage containing chamber 62. Thus, the configuration in which the external peripheral edge of the spacer mounting portion 60a projects outwardly in the radial direction more than the external peripheral edge of the base 57a is not indispensable.

In addition, a cross-sectional shape of the stage containing chamber 62 vertical to the axis is a cross-sectional shape which has no step and is uniform in the entire region along the axial direction, and is a cross-sectional shape formed in accordance with an external peripheral surface shape of the spacer mounting portion 60a of the cooling stage unit 60. A size of this cross-sectional shape (length of the stage containing chamber 62 in the radial direction) is set to be a size that enables contact with the spacer mounting portion 60a of the cooling stage unit 60 in a normal temperature state, that is, the external peripheral edge of the spacer 59 in a non-contracted state in the cooling stage unit 60. Accordingly, it is configured such that the cooling stage unit 60 causes the spacer 59 to have contact with the internal peripheral surface of the pot main body 61 serving as the wall surface of the stage containing chamber 62 in the normal temperature state, the cooling stage unit 60 becomes coaxial with the pot main body 61 in the state of being contained in the stage containing chamber 62, and a gap g2 (see FIG. 2) is formed around the circumference of the fin portion 60b between the external peripheral edge of the fin portion 60b of the cooling stage unit 60 and the internal peripheral surface of the pot main body 61, in the illustrated example. Incidentally, a gap length of the gap g2 is not necessarily formed to have a same gap length at the entire region around the circumference of the fin portion 60b.

Accordingly, a non-contact space 67 having the gaps g1 and g2 is formed between the fin portion 60b of the cooling stage unit 60 and a bottom-side main body portion 61a of the pot main body 61. In addition, it is configured such that a gap g3 (see FIG. 2) is also formed between the peripheral surface of the base 57a and the internal peripheral surface of the pot main body 61 when the peripheral surface of the base 57a formed to project on the housing surface of the freezer main body 53 and the internal peripheral surface of the pot main body 61 are superimposed on each other.

The pot main body 61 is configured by coaxially joining and fixing the bottom-side main body portion 61a having a portion to contain the fin portion 60b of the cooling stage unit 60 and an opening-side main body portion 61b having a portion to contain the spacer mounting portion 60a of the cooling stage unit 60 to be integrated. The bottom-side main body portion 61a is configured using a heat conducting material, but the opening-side main body portion 61b is configured using a heat insulating material (material having extremely lower thermal conductivity than the bottom-side main body portion 61a). Accordingly, it is configured such that a portion of the gas pot 51 to be cooled by the fin 58, which is tightly fixed to the stage 57b of the cooling stage 57 and the stage distal end 57c as the most cooling face of the cooling stage 57, can be limited to the bottom-side main body portion 61a. At the same time, the entry of heat from the outside to the cooled bottom-side main body portion 61a is performed using the opening-side main body portion 61b made of the heat insulating material, and thus, the heat is blocked and reduced by the opening-side main body portion 61b. Accordingly, speed of cooling the bottom-side main body portion 61a of a gas pot 51 performed by the cooling stage 57 is improved, and improvement in cooling efficiency is achieved.

The cooling mechanism 50 is configured by arranging the fin portion 60b and the spacer mounting portion 60a of the cooling stage unit 60, inserted from an opening on the other end side of the pot main body 61 of the gas pot 51, to be contained in the stage containing chamber 62 in such a manner that the cooling stage unit 60 and the gas pot 51 are coaxial, and connecting the gas pot 51 to the freezer main body 53 to be integrated. Further, when the cooling stage unit 60 is arranged to be contained in the stage containing chamber 62, only the external peripheral edge of the spacer mounting portion 60a of the cooling stage unit 60 can be in contact with the internal peripheral surface of the gas pot 51, and the other peripheral surface portion including the fin portion 60b of the cooling stage unit 60 is configured not to nave contact with the internal peripheral surface of the gas pot 51.

On the other hand, the bottom-side main body portion 61a of the pot main body 61 configured using the heat conducting material is thermally connected to the emitter tip 45 provided in the ion source containing housing portion 23 of the ion source housing 22 via a cooling conduction mechanism 70.

The cooling conduction mechanism 70 is configured to include, for example a gold-plated copper mesh portion, and the cooling conduction mechanism 70 itself can be deformed, such as deflected or bent, by deformation of the copper mesh portion. Accordingly, even if relative arrangement between the bottom-side main body portion 61a of the pot main body 61 and the emitter tip 45 is slightly deviated, the cooling conduction mechanism 70 is configured to be capable of absorbing the deviation and connecting and holding the bottom-side main body portion 61a and the emitter tip 45 without being damaged as the copper mesh portion is deformed.

The connection between the gas pot 51 and the freezer main body 53 is performed using a tubular bellows 63 that is stretchable. The tubular bellows 63 is configured to include an internal peripheral surface capable of opposing the peripheral surface of the base 57a to be separated by a predetermined distance without abutment of the peripheral surface of the base 57a in a state where the cooling stage unit 60 is coaxially interpolated. The tubular bellows 63 includes a pot connecting frame 65, at one end side, which can be joined with an attachment flange 64 integrally formed at the other end of the pot main body 61 of the gas pot 51. The other end side of the tubular bellows 63 is tightly fixed to the freezer main body 53.

In the present embodiment, the gas pot 51 is arranged to be contained in the pot containing housing portion 24 through the cooling mechanism mounting port 29 of the ion source housing 22 in advance at the time of connecting the gas pot 51 and the freezer main body 53 using the tubular bellows 63. For example, a state is formed in which the attachment flange 64 of the pot main body 61 is airtightly attached to an attachment flange 66 formed at the projecting end of the pot containing housing portion 24 using a seal member such as packing (not illustrated). On the other hand, the other end side of the tubular bellows 63 is tightly fixed to the freezer main body 53, and the state where the cooling stage unit 60 is coaxially interpolated is formed. Thus, the connection between the gas pot 51 and the freezer main body 53 is performed by airtightly joining and connecting the pot connecting frame 65 of the tubular bellows 63 fixed, in advance, to the freezer main body 53 with the attachment flange 64 of the pot main body 61 or the attachment flange 66 of the pot containing housing portion 24 using the seal member such as packing (not illustrated). At this time, the fin portion 60b and the spacer mounting portion 60a of the cooling stage unit 60 are arranged in the stage containing chamber 62 of the gas pot 51 to be coaxial with the gas pot 51 through an opening on the other end side of the pot main body 61.

In the state where the pot connecting frame 65 of the tubular bellows 63 is airtightly joined and connected with the attachment flange 64 of the pot main body 61 or the attachment flange 66 of the pot containing housing portion 24, a vibration suppressing space 68, which is airtightly defined from the external atmosphere (atmosphere of the room in which the scanning ion microscope 10 is provided), is formed between the internal peripheral surface of the tubular bellows 63 and the peripheral surface of the base 57a formed to project on the housing surface of the freezer main body 53, and the non-contact, space 67 is formed inside the stage containing chamber 62.

Thereafter, a heat conducting medium is stored in the non-contact space 67, and a vibration damping medium is stored in the vibration suppressing space 68. In the present embodiment, the communication between the non-contact space 67 and the vibration suppressing space 68 inside the gas pot 51 is caused by the spacer 59 whose volume has been reduced when the bottom-side main body portion 61a of the pot main body 61 is cooled by the cooling stage unit 60. Thus, the same kind of medium, for example, a helium gas is used as the heat conducting medium and the vibration damping medium. Accordingly, the same helium gas is fed into the non-contact, space 67 and the vibration suppressing space 68, and is stored in each of the two spaces 67 and 68 to be isolated from the helium gas as the ionization gas that has been supplied to the gas ionization chamber 25. Hereinafter, the heat conducting medium and the vibration damping medium made of the common helium gas will be collectively referred to as a heat conducting medium 69.

Regarding the feeding of the heat conducting medium 69 into each of the two spaces 67 and 68, the present embodiment is configured such that, if the helium gas is fed into any one side of the two spaces 67 and 68, the helium gas is also fed into the other side. That is, the spacer 59 attached to the stage 57b of the cooling stage 57 is configured using the foamed resin, and a peripheral surface thereof is microscopically a large uneven surface and has a number of fine microscopic clearances in the present embodiment, and thus, the medium can be fed into the other side through the fine microscopic clearances only by feeding the medium into any one side of the two spaces 67 and 68 even in a case where the peripheral surface of the spacer 59 is in contact with the internal peripheral surface of the opening-side main body portion 61b of the pot main body 61 in the entire region along the circumferential direction in the normal temperature state. Thus, it is configured such that a separate gas supply piping (not illustrated) connected to the gas source 47 of the same helium gas communicates with the vibration suppressing space 68 inside the gas pot 51 and enables the heat conducting medium 69 to be stored in the non-contact space 67 and the vibration suppressing space 68 in the illustrated example, which is similar to the gas supply piping 48.

On the other hand, the freezer main body 53 is mounted and fixed onto a support, stand 83 different from the base plate 15 to which the device main body 11 of the scanning ion microscope 10 is mounted and fixed such that the axis direction of the cooling stage unit 60 projecting in the rod shape is aligned with a height position of the cooling mechanism mounting port 29 provided in the pot containing housing portion 24 of the ion source housing 22. In the present embodiment, an opening direction of the cooling mechanism mounting port 29 in the ion source housing 22 is oriented in the horizontal direction, when an attitude of the device main body 11 is in a horizontal state. Accordingly, the freezer main body 53 is also mounted and fixed onto the support stand 83 facing the freezer main body 53 such that the axis direction of the cooling stage unit 60 becomes the horizontal direction. Incidentally, the mounting attitude of the freezer main body 53 on the support stand 83 is changed depending on a change of a containing direction of the gas pot 51 (direction of the cooling mechanism mounting port 29) in the pot containing housing portion 24 of the ion source housing 22.

The support stand 83 has a structure which includes a base stand 84, a fulcrum 85, and a position adjusting and fixing mechanism 87. The fulcrum 85 is erected on the base stand 84 and has a length in accordance with a height position of the pot containing housing portion 23 of the scanning ion microscope 10. The position adjusting and fixing mechanism 87 includes a mounting portion 88 to which the freezer main body 53 is mounted and fixed, and is attached and fixed to the attachment portion 86 of the fulcrum 85. The position adjusting and fixing mechanism 87 has a structure which enables elevation, rotation or inclination of the mounting portion 88 within a range of a predetermined amount, and is capable of finely adjusting an attitude state of the freezer main body 53 mounted and fixed to the mounting portion 88 in a tolerable range based on the predetermined amount range.

Next, a description will be given regarding the assembly of the cooling mechanism 50 and position adjustment between the fin 58 and the gas pot 51 performed by the spacer 59 at the time of assembly relating to the cooling mechanism 50 provided in the scanning ion microscope 10 according to the present embodiment, on the basis of FIG. 1 to FIG. 6(b)

FIG. 3 corresponds to a state in which the freezer 60 in which the fin 58 is joined and fixed to the cooling stage 57 and the gas pot 51 attached to the ion source containing housing portion 23 of the ion source housing 22 are not yet assembled.

In FIG. 3, the illustrated arrow indicates the containing direction in which the fin portion 60b and the spacer mounting portion 60a of the cooling stage unit 60 is inserted through the other-end-side opening of the pot main body 61 of the gas pot 51 and is arranged to be contained in the stage containing chamber 62 such that the cooling stage unit 60 and the gas pot 51 become coaxial. Such containing work of the cooling stage unit 60 into the stage containing chamber 62 of the gas pot 51 is performed under the normal temperature.

FIG. 4 corresponds to a state after the freezer 60 in which the fin 58 is joined and fixed to the cooling stage 57 and the gas pot 51 attached to the ion source containing housing portion 23 of the ion source housing 22 have been assembled. Incidentally, the non-contact space 67 and the vibration suppressing space 68 formed by the assembly is not sealed with the heat conducting medium 69 yet in the illustrated state. Thus, the spacer 59 remains in the normal temperature state without being cooled. Incidentally, FIGS. 3 and 4 do not illustrate the ion source housing 22 to which the gas pot 51 has been rigidly attached in advance before the assembly.

Only the spacer mounting portion 60a of the cooling stage unit 60 is contained in the pot main body 61 at the time of containing the cooling stage unit 60 in the stage containing chamber 62 of the gas pot 51 as illustrated in FIG. 3, and only the external peripheral edge of the tubular spacer 59 in the non-contracted state is contained in the pot main body 61 in the case of the present embodiment, while being in contact with and supported by the internal peripheral surface of the pot main body 61 over the entire region around the circumference thereof which serves as the wall surface of the stage containing chamber 62. Thus, it is possible to arrange the cooling stage unit 60 to be coaxial with the pot main body 61 forming the stage containing chamber 62. That is, the cooling stage unit 60 can be arranged in the stage containing chamber 62 without any deviation or inclination of the axis thereof from the axis of the pot main body 61.

Further, the pot connecting frame 65 is airtightly joined and connected to the attachment flange 64 of the pot main body 61 or the attachment flange 66 of the pot containing housing portion 24 using the seal member such as packing (not illustrated) in a state where the external peripheral edge of the spacer 59 in the non-contracted state is in contact with and supported by the internal peripheral surface of the pot main body 61 over the entire region around the circumference thereof serving as the wall surface of the stage containing chamber 62, and thus, the coaxiality of the cooling stage unit 60 and the pot main body 61 is not compromised even in such joining and connection.

In addition, if the size of the shape of the external peripheral edge of the spacer mounting portion 60a viewed in the axis direction of the cooling stage unit 60 is smaller than the size of the internal peripheral shape of the stage containing chamber 62 viewed in the axis direction of the pot main body 61, only the external peripheral edge of the spacer mounting portion 60a of the cooling stage unit 60 can be in contact with the internal peripheral surface of the gas pot 51, and the other peripheral surface portion including the fin portion 60b of the cooling stage unit 60 has no contact with the internal peripheral surface of the gas pot 51. In this manner, even when only a part of the spacer 59 along the circumference thereof is in contact with the internal peripheral surface of the pot main body 61 serving as the wall surface of the stage containing chamber 62, the contact portion of the spacer 59 regulates contact between the other portion of the cooling stage unit 60 and the internal peripheral surface of the pot main body 61. In this case, only the contact portion of the spacer mounting portion 60a of the cooling stage unit 60 is supported by the internal peripheral surface of the pot main body 61, but an inclination angle θ expressed by inclination of the axis of the pot main body 61 with respect to the axis of the cooling stage unit 60 is reliably suppressed to be a value or smaller, the value obtained when the part of the spacer 59 corresponding to the contact portion of the spacer mounting portion 60a is in contact with the internal peripheral surface of the stage containing chamber 62.

Incidentally, the case where the size of the shape of the external peripheral edge of the spacer mounting portion 60a viewed in the axis direction of the cooling stage unit 60 is smaller than the size of the internal peripheral shape of the stage containing chamber 62 viewed in the axis direction of the pot main body 61 includes a case where the shape of the external peripheral edge of the spacer mounting portion 60a viewed in the axis direction of the cooling stage unit 60 is similar to the internal peripheral shape of the stage containing chamber 62 viewed in the axis direction of the pot main body 61, a case where both the shapes are different from each other, and the like.

Figure 5A:
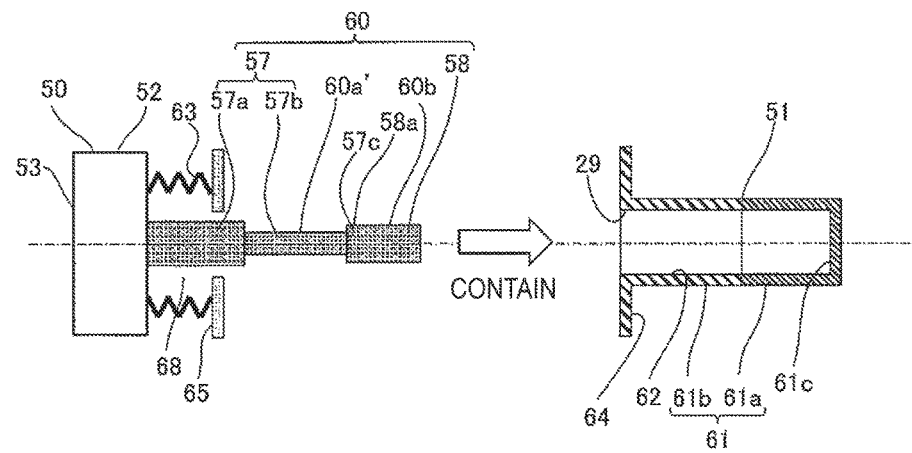
FIGS. 5(a) to 5(c) are explanatory diagrams of a cooling stage unit which does not include a spacer as a comparative example relating to position adjustment between a fin and a gas pot.
Figure 5B:
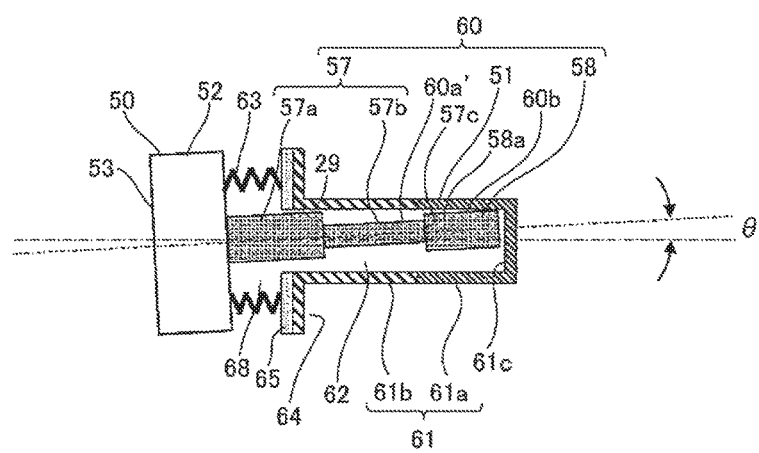
Figure 5C:
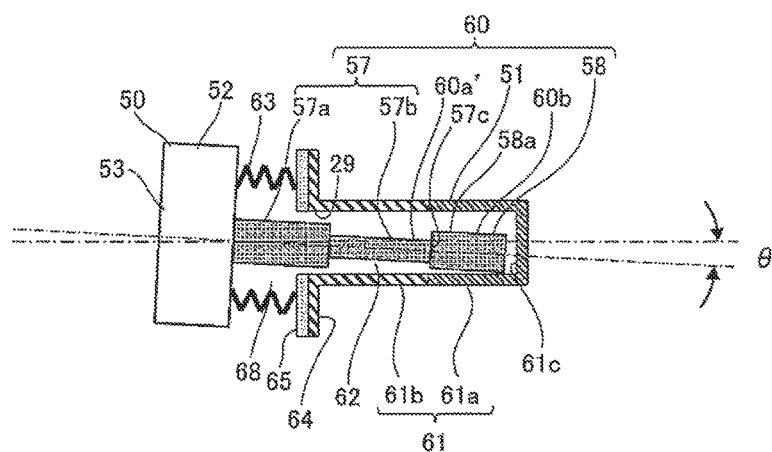
Figure 6:
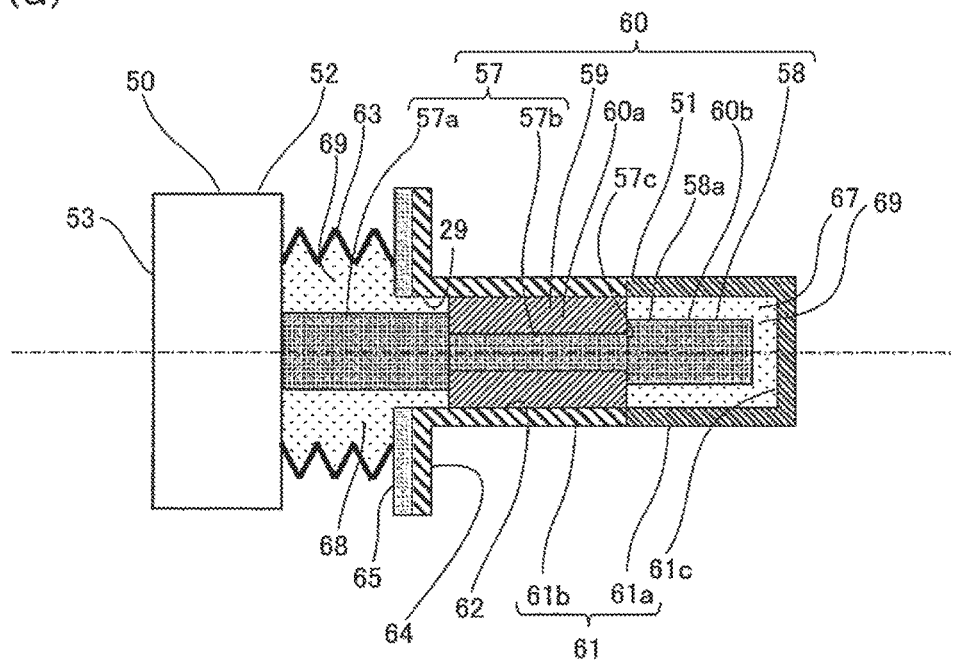
FIGS. 6(a) and 6(b) are views for comparison between a normal temperature state and a cooling state in the cooling stage unit and gas pot section illustrated in FIG. 2.
Figure 6:
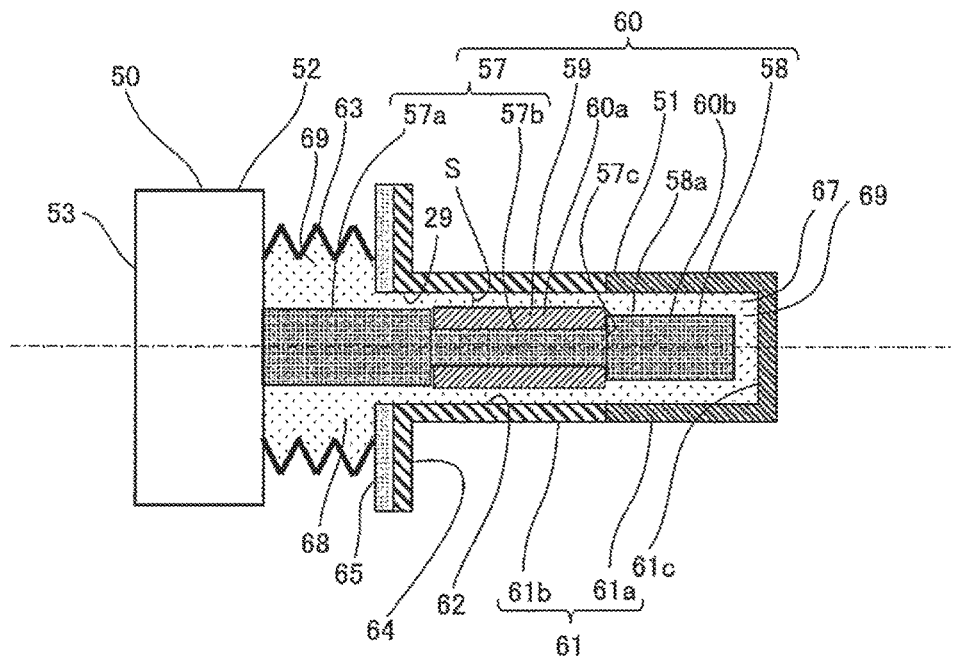

FIGS. 5(a) to 5(c) are explanatory diagrams of a cooling stage unit which does not include the spacer as a comparative example relating to position adjustment between a fin and a gas pot.

FIG. 5(a) corresponds to a state where the freezer 60 in which the fin 58 is joined and fixed to the cooling stage 57 and the gas pot 51 attached to the ion source containing housing portion 23 of the ion source housing 22 are not yet assembled. In FIG. 5(a), the illustrated arrow indicates a containing direction in which the cooling stage unit 60 is contained in the stage containing chamber 62 of the gas pot 51. FIGS. 5(b) and 5(c) correspond to states after the freezer 60 in which the fin 58 is joined and fixed to the cooling stage 57 and the gas pot 51 attached to the ion source containing housing portion 23 of the ion source housing 22 have been assembled. Incidentally, the respective units have the same configurations as those in the cooling mechanism 50 according to the present embodiment illustrated in FIGS. 1 to 3 except that the spacer 59 is not provided, and thus, will be denoted by the same reference signs, and detailed individual description thereof will be omitted.

In the cooling stage unit 60 according to the comparative example configured using an assembly in which the fin 58 is connected and fixed to the cooling stage 57 and the spacer 59 is not provided, a clearance having a length, which corresponds to a sum of a length of a spacer non-mounting portion 60a' and a length of the fin portion 60b in the axis direction, is formed between the external peripheral surface of the cooling stage unit 60 and the internal peripheral surface of the gas pot 51. Thus, the tolerance greater than necessary is given with respect to eccentricity of the cooling stage unit 60 in the stage containing chamber 62 and the inclination of the cooling stage unit 60, expressed by the inclination angle θ, in the stage containing chamber 62.

Accordingly, even if the cooling stage unit 60 is positioned with respect to the stage containing chamber 62 such that the cooling stage unit 60 becomes coaxial with the gas pot 51 and the clearance is formed between the external peripheral surface of the cooling stage unit 60 and the internal peripheral surface of the gas pot 51 before the assembly of the freezer 60 and the gas pot 51, the tolerance with respect to the eccentricity and the inclination of the cooling stage unit 60 is in the state of being greater than necessary. As a result, when the pot connecting frame 65 is actually joined and connected to the pot main body 61 or the attachment flanges 64 and 66 of the pot containing housing portion 24, there may occur a case where the cooling stage unit 60 becomes eccentric in the stage containing chamber 62 or the cooling stage unit 60 is inclined as illustrated in FIGS. 5(b) and 5(c) so that the fin portion 60b is brought into contact with the internal peripheral surface of the stage containing chamber 62.

Meanwhile, relating to the assembly of the cooling mechanism 50, only a predetermined amount of the heat conducting medium 69 is fed into a space of the gas pot 51 incorporated with the cooling stage 57 to seal the space when the assembly of the freezer 60 in which the fin 58 is joined and fixed to the cooling stage 57 and the gas pot 51 attached to the ion source containing housing portion 23 of the ion source housing 22 is completed in the scanning ion microscope 10. At this time, even when the spacer 59 is configured as the tubular spacer 59 that is in contact with the internal peripheral surface of the pot main body 61 over the entire region along the circumferential direction thereof as in the present embodiment, it is possible to feed the heat conducting medium 69 into the other side even by feeding the heat conducting medium 69 into any one side of the two spaces 67 and 68 since the spacer 59 is formed, using the porous material with the heat insulating property. For example, when the heat conducting medium 69 is fed into the vibration suppressing space 68, the heat conducting medium 69 can be fed up to the non-contact space 67 at an inner portion of the gas pot 51 through the microscopic clearance in the spacer 59 even using the tubular spacer 59 that is in contact with the internal peripheral surface of the pot main body 61 over the entire region along the circumference thereof. FIG. 2 corresponds to the cooling stage unit 60 and the gas pot 51 section in the state where the heat conducting medium 69 is fed into and stored in the non-contact space 67 and the vibration suppressing space 68.

In the cooling mechanism 50 of the scanning ion microscope 10 according to the present embodiment assembled in this manner, the spacer 59 contracts when being cooled so that the volume thereof decreases as compared to the normal temperature state. Then, the external peripheral edge of the peripheral surface of the spacer 59 that has been brought into contact with the internal peripheral surface of the pot main body 61 is separated from the internal peripheral surface of the pot main body 61, and the cooling stage unit 60 has no direct physical contact with the internal peripheral surface of the pot main body 61 in the entire region along the circumference thereof. Accordingly, a clearance S (see FIGS. 6(a) and 6(b)) is formed between the cooling stage unit 60 and the internal peripheral surface of the pot main body 61.

In addition, the cooling is performed using coldness obtained by the cooling stage unit 60 of the freezer 52 configured to cool the emitter tip 45 to generate the ion beam 21. Thus, the cooling is performed at operation temperature of the ion beam device during the cooling. This operation temperature of the ion beam device corresponds to, for example, cooling temperature of the emitter tip set in response to a peak of an ion current (for example, several K to several tens of K when the ionization gas is the helium gas).

FIGS. 6(a) and 6(b) are views for comparison between the normal temperature state and a cooling state in the cooling stage unit and gas pot section illustrated in FIG. 2. FIG. 6(a) illustrates the cooling stage unit and gas pot section in the normal temperature state, and FIG. 6(b) illustrates the cooling stage unit and gas pot section in the normal temperature state.

Accordingly, when the external peripheral surface of the cooling stage unit 60 and the internal peripheral surface of the gas pot 51 are in contact with each other at the time of completing the assembly in the assembly of the freezer 60 and the gas pot 51, the internal peripheral surface of the gas pot 51 is only in contact with the spacer 59 in the external peripheral surface of the cooling stage unit 60 in the present embodiment. Thus, the clearance S is reliably secured between the external peripheral surface of the cooling stage unit 60 and the internal peripheral surface of the pot main body 61, in the entire region along the circumferential direction thereof, due to the contraction of the spacer 59 between the cooling stage unit 60 and the gas pot 51 whose relative arrangement positions are fixed at the time of completing the assembly in a situation where the scanning ion microscope 10 is used and the freezer 52 is driven. Along with this, further, it is unnecessary to take into consideration of the contact between the fin portion 60b of the cooling stage unit 60 and the internal peripheral surface of the pot main body 61 as illustrated in FIGS. 5(*a*) to 5(*c*) at a step of positioning the cooling stage unit 60 with respect to the stage containing chamber 62 when the freezer 60 and the ion source housing 22 are assembled and fixed. Accordingly, assembly work of assembling the freezer 60 and the ion source housing 22 becomes easy and efficient.

To be specific, the positional relationship between the external peripheral edge of the fin 58 and the internal peripheral surface of the pot main body 61 can be roughly set in response to a size of the clearance S specified by the spacer 59. In addition, it is possible to prevent the inclination angle θ exceeding the tolerable range from being generated between the cooling stage unit 60 and the gas pot 51 when the cooling stage unit 60 is arranged to be contained in the stage containing chamber 62 of the gas pot 51. As a result, the clearance S is reliably secured between the external peripheral surface of the cooling stage unit 60 and the internal peripheral surface of the pot main body 61 in the entire region along the circumference thereof, and it is possible to prevent the direct physical contact between the fin 58 and the internal peripheral surface of the pot main body 61. It is possible to more strictly design the gap g2 between the external peripheral edge of the fin 58 and the internal peripheral surface of the pot main body 61 than ever before by managing the size of the shape of the external peripheral edge of the spacer 59 viewed in the axis direction thereof between the normal temperature state and the cooling state although it is difficult to visually confirm the state after the assembly of the freezer 60 and the ion source housing 22.

In addition, the spacer 59 of the cooling mechanism 50 has the temperature reversibility so that the spacer 59 returns to the original size when returning to the normal temperature. Accordingly, for example, when the freezer 60 is separated from the device main body 11 integrated with the ion source housing 22 in order for maintenance of the freezer 52, or when the ion source housing 22 is separated from the freezer 52 and the vacuum chamber 32 in order to replace the emitter tip 45, the spacer 59 can be used in the assembly again at the time of assembling the freezer 60 or the ion source housing 22 again after completing such work.

Further, this configuration of the cooling mechanism 50 to prevent the direct physical contact between the fin 58 and the internal peripheral surface of the pot main body 61 prevents the vibration transmitted from the cooling mechanism 50 to the emitter tip 45 from being transmitted to the ion source housing 22 to which the emitter tip 45 and the gas pot 51 of the cooling mechanism 50 are rigidly connected in order for anti-vibration of the emitter tip 45.

In this case, there are major kinds of vibration, such as the vibration generated by the freezer main body 53 of the freezer 52, the vibration of the compressor 54 to be transmitted to the freezer main body 53 via the high-pressure piping 55 and the low-pressure piping 56, and the vibration from the floor 12 to be transmitted to the freezer main body 53 via the support stand 83 and the position adjusting and fixing mechanism 87, as the vibration which has a risk of being transmitted to the emitter tip 45 from the cooling mechanism 50 via the ion source housing 22. The vibration from the freezer main body 53 is mechanical vibration generated by the own device, and is mainly cause as the displacer repeats the reciprocation at high speed inside the cylinder. In addition, the vibration from the floor 12 also includes the vibration of the compressor 54. Further, the both kinds of vibration correspond to the vibration that is transmitted from the freezer main body 53. Meanwhile, the freezer 52 is also driven when the scanning ion microscope 10 is used, the spacer 59 contracts due to the coldness generated by the cooling stage unit 60, the cooling stage unit 60 has no direct physical contact with the internal peripheral surface of the pot main body 61 at the distal end thereof and in the entire region along the circumference thereof, the end face gap g1 is formed between the cooling stage unit 60 and the containing chamber bottom 61*c* of the pot main body 61, and the clearance S is formed between the cooling stage unit 60 and the internal peripheral surface of the pot main body 61. Thus, the vibration transmitted from the freezer main body 53 is not transmitted to the gas pot 51, that is, the ion source housing 22 via the cooling stage unit 60, and particularly via the fin 58 thereof. As a result, the freezer main body 53 and the ion source housing 22 have only indirect physical contact with each other with the bellows 63 interposed therebetween, and thus, the vibration transmitted from the freezer main body 53 is reduced to a level that does not cause the problem in practical use by elasticity and stretchability of the bellows 63 and the heat conducting medium 69 as the vibration damping medium stored in the vibration suppressing space 68 inside the bellows 63.

Incidentally, the factors causing the vibration transmitted from the freezer main body 53 have been exemplified, but the vibration source is not limited only to the exemplified factors. In addition, the description has been given by exemplifying the pot containing housing portion 24 in which the containing direction of the cooling stage unit 60 of the freezer 52 with respect to the stage containing chamber 62 is the horizontal direction as a mechanism for reduction of the vibration transmitted from the freezer main body 53. However, the present invention can be applied also to an ion beam device which includes the pot containing housing portion 24 in which the containing direction of the cooling stage unit 60 is set to a direction other than the horizontal direction.

Accordingly, the vibration from the freezer main body 53 is not transmitted to the gas pot 51 rigidly attached to the ion source housing 22 at the time of using the scanning ion microscope 10 according to the present embodiment, and thus, there is no problem that the emitter tip 45 vibrates and the ion beam 21 is hardly focused. In addition, there is no need of setting the gap between the gas pot 51 and the cooling stage unit 60, and particularly between the fin 58 and the internal peripheral surface of the gas pot 51 to be wide more than enough taking into consideration of the prevention of contact therebetween in order to avoid the above-described problem. Thus, it is unnecessary to set the gap g2 between the internal peripheral surface of the gas pot 51 and the external peripheral edge of the fin 52 to be wide to prevent the vibration from the freezer main body 53 from being transmitted to the ion source housing 22 and to the emitter tip 45 via the gas pot 51, and thus, it is possible to prevent a situation that the cooling temperature of the emitter tip 45 tends to be higher than the original cooling temperature of the freezer 52 caused as cooling performance of the ionization gas deteriorates.

Next, cooling performance of the scanning ion microscope 10 according to the present embodiment will be described on the basis of FIG. 2.

A distal-end-side portion of the stage 57*b* of the cooling stage 57 becomes a low temperature portion which is cold in the freezer 52. Thus, the cooling efficiency with respect to the gas pot 51 becomes more favorable as the area of the low temperature portion increases in the case of cooling the gas pot 51 using the heat conducting medium 64. Thus, the fin 58 is joined and fixed to the distal end 57 of the cooling stage 57 so as to enlarge the surface area of the low temperature portion of the cooling stage 57. In addition, the gas pot 51 is configured such that the bottom-side main body portion 61a is formed using the heat conducting material and the opening-side main body portion 61b is formed using the heat insulating material so as to limit a main cooled portion to the bottom-side main body portion 61a formed using the heat conducting material, and the heat entry to the opening-side main body portion 61b, which has been cooled by the fin 58, is reduced by the opening-side main body portion 61b formed using the heat insulating material.

In addition, it is preferable to set the end face gap g1 between the fin 58 and the containing chamber bottom 61c of the pot main body 61 in a vibration direction to be large from a viewpoint of preventing the vibration transmitted from the freezer main body 53, and particularly, the vibration generated as the displacer repeats reciprocation at high speed inside the cylinder from being transmitted to the gas pot 51. When the end face gap g1 is set to be large, however, the cooling performance of the fin 58 with respect to the containing chamber bottom 61c of the pot main body 61 decreases. Thus, it is preferable to set the side surface gap g2 between the fin 58 and the internal peripheral surface of the pot main body 61 as narrow as possible in order to complement such a decrease in cooling performance of the fin 58 with respect to the containing chamber bottom 61c of the pot main body 61 to improve the cooling efficiency. In regard to this point, it is possible to roughly set the positional relationship between the external peripheral edge of the fin 58 and the internal peripheral surface of the pot main body 61 in response to the size of the clearance S specified by the spacer 59 in the present embodiment, and thus, it is possible to easily and accurately narrow the side surface gap g2.

Accordingly, the gas pot 51 is configured so as to narrow the side surface gap g2 to narrow down a cooling target to the bottom-side main body portion 61a, and to be protected from the heat entry from the outside by the opening-side main body portion 61b to be capable of efficiently using the coldness of the fin 58 for the cooling thereof.

Figure 7A:
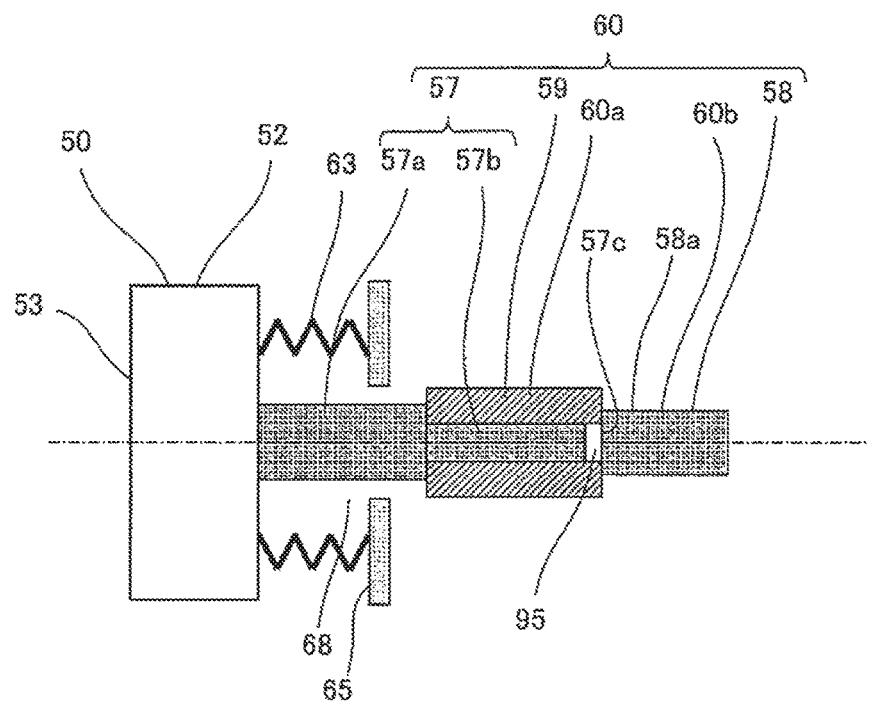
FIGS. 7(a) and 7(b) are configuration diagrams of a modified example of an assembly obtained by connecting and fixing a fin to a cooling stage.
Figure 7B:
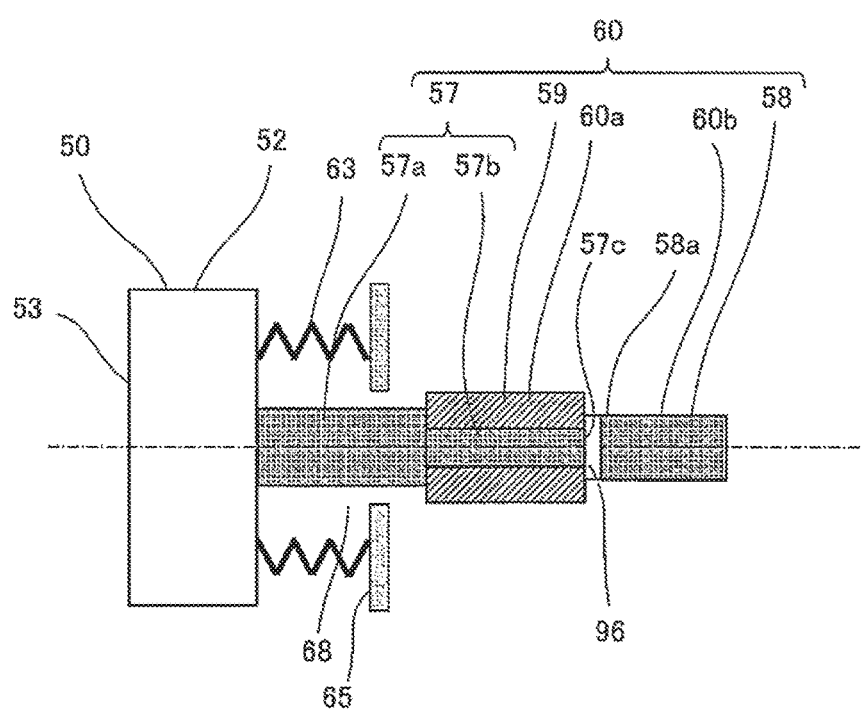

In addition, it is possible to achieve further improvement in cooling performance by configuring an assembly obtained by connecting and fixing the fin 58 to the cooling stage 57 as illustrated in FIGS. 7(a) and 7(b) in relation to the cooling performance of the cooling stage unit 60 with respect to the gas pot 51.

FIGS. 7(a) and 7(b) are configuration diagrams of a modified example of the assembly obtained by connecting and fixing the fin to the cooling stage. Incidentally, when a configuration of the assembly is described, the same components as those of the assembly illustrated in FIG. 3 will be denoted by the same reference signs, and the detailed description thereof will be omitted.

Relating to the assembly in the cooling stage unit 60 obtained by joining and fixing the fin 58 to the cooling stage 57, the cooling performance of the cooling stage unit 60 with respect to the gas pot 51 is improved as the contact area therebetween increases, that is, each efficiency of heat conduction of joining and fixing surfaces thereof is higher. From this viewpoint, both the joining and fixing surfaces are not completely flat but are uneven surfaces when the respective surfaces are microscopically viewed. Thus, concave surfaces of the uneven surfaces have no contact with each other when the cooling stage 57 and the fin 58 are simply joined and fixed to each other, thereby decreasing the contact area.

Thus, the cooling stage unit 60 illustrated, in FIG. 7(a) is configured such that a thermally conductive sheet 95 made of a soft material and has favorable heat conduction, such as indium, is interposed and sandwiched between the cooling stage 57 and the fin 58 in advance before joining and fixing both the cooling stage 57 and the fin 58. Accordingly, the thermally conductive sheet 95 is deformed to bury the uneven surfaces generated in the respective joining and fixing surfaces at the time of joining and fixing the fin 58 to the cooling stage 57, thereby improving the efficiency of heat conduction between both the joining and fixing surfaces.

On the contrary, a thermally conductive film 96 made of a soft material which is soft and has favorable heat conduction, such as gold plating, is formed on a surface of the fin 58 to be joined and fixed to the cooling stage 57 in the cooling stage unit 60 illustrated in FIG. 7(b). Accordingly, the thermally conductive film 96 is deformed to bury the uneven surfaces generated in the respective joining and fixing surfaces at the time of joining and fixing the fin 58 to the cooling stage 57, thereby improving the efficiency of heat conduction between both the joining and fixing surfaces.

Figure 8:
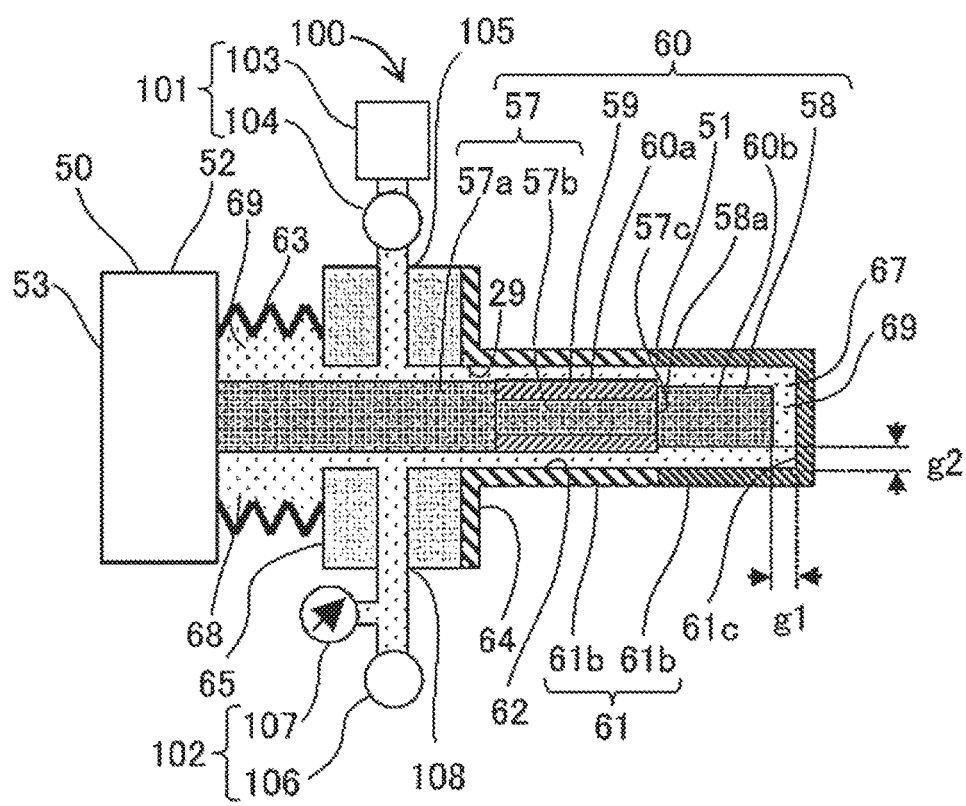
FIG. 8 is a configuration diagram of a cooling mechanism that includes a heat conducting medium adjusting mechanism.

In addition, it is possible to achieve further improvement in cooling performance, in relation to the cooling performance of the cooling stage unit 60 with respect to the gas pot 51, by providing a heat conducting medium adjusting mechanism 100, which adjusts a storage amount of the heat conducting medium 69 in each of the vibration suppressing space 68 and the non-contact space 67 as illustrated in FIG. 8, in the cooling mechanism 50.

FIG. 8 is a configuration diagram of a cooling mechanism that includes a heat conducting medium adjusting mechanism.

Figure 9A:
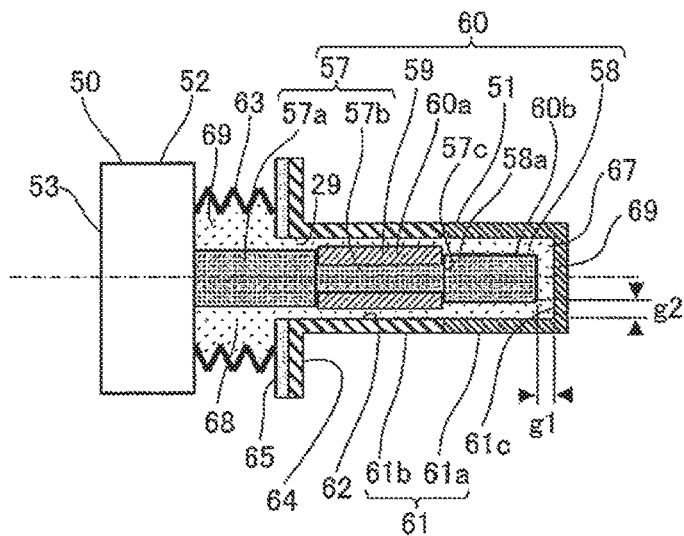
FIGS. 9(a) to 9(c) are explanatory diagrams of an operation state of a cooling mechanism that does not include the heat conducting medium adjusting mechanism as a comparative example.
Figure 9B:
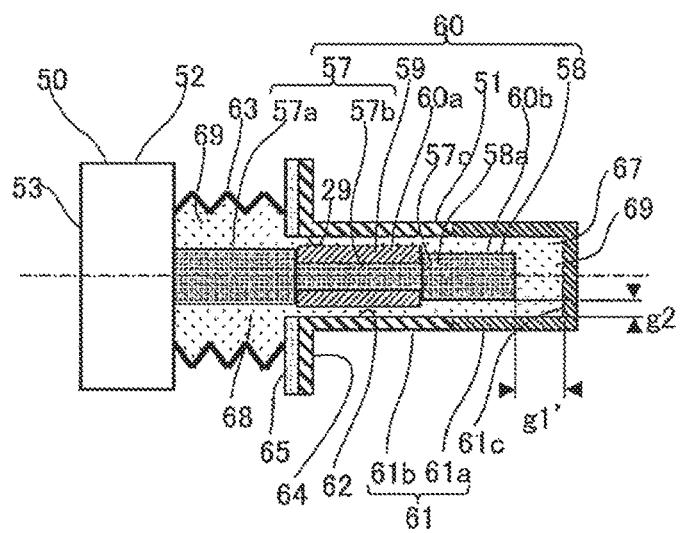
Figure 9C:
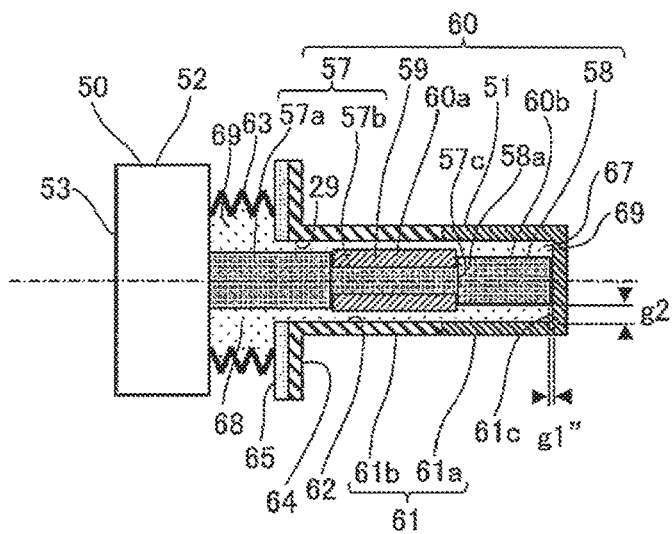

FIGS. 9(a) to 9(c) are explanatory diagrams of an operation state of a cooling mechanism that does not include the heat conducting medium adjusting mechanism as a comparative example.

Incidentally, in the description of a configuration of the cooling mechanism that includes the heat conducting medium adjusting mechanism according to the present example, the same or similar components as those in the configuration of the cooling mechanism illustrated in FIG. 2 will be denoted by the same reference signs, and the detailed description thereof will be omitted.

As illustrated in FIG. 8, the heat conducting medium adjusting mechanism 100 is configured to include a heat conducting medium supply mechanism 101 which supplies the heat conducting medium 69 to each of the vibration suppressing space 68 and the non-contact space 67 of the cooling mechanism 50 to be stored therein, and a heat conducting medium discharge mechanism 102 which discharges the stored heat conducting medium 69 from each of the vibration suppressing space 68 and the non-contact space 67 of the cooling mechanism 50.

The heat conducting medium supply mechanism 101 includes a heat conducting medium source 103 and a regulator 104, and is connected to a heat conducting medium port 105 formed in the pot connecting frame 65 via an anti-vibration mechanism (not illustrated). On the other hand, the heat conducting medium discharge mechanism 102 includes the check valve 106 and the pressure gauge 107 and is connected to a heat conducting outlet 108 formed in the pot connecting frame 65 via an anti-vibration mechanism (not illustrated).

Meanwhile, when heating is performed to sharpen the emitter tip 45 in the case of the scanning ion microscope 10 illustrated in FIG. 1, for example, the heat of the emitter tip 45 is transmitted from the cooling conduction mechanism 70 to the bottom-side main body portion 61a of the pot main body 61 formed using the heat conducting material in the gas pot 51, and the non-contact space 67 of the cooling mechanism 50 and the heat conducting medium 69 stored in the vibration suppressing space 68 communicating with the non-contact space 67 are heated. Accordingly, the non-contact space 67, the heat conducting medium 64, and the respective heat conducting media 69 are expanded and each volume thereof increases. Along with this, the bellows 63 of the cooling mechanism 50 is deformed to be stretchable as illustrated in FIG. 9(b) from an initial state illustrated in FIG. 9(a), and the cooling stage unit 60 is extruded outwardly inside the stage containing chamber 62. As a result, the positional relationship between the fin 58 and the containing chamber bottom 61c of the pot main body 61, which is formed using the heat conducting material, of the gas pot 51 is changed to be separated from each other, and it becomes difficult to perform the cooling efficiently.

In addition, for example, when the cooling using the cooling mechanism 50 is performed from the room temperature, the heat conducting medium 69 stored in the non-contact space 67 and the vibration suppressing space 68 contracts and is decreased in volume as the temperature of the gas pot 51 is cooled. Along with this, the bellows 63 of the cooling mechanism 50 is deformed to contract as illustrated in FIG. 9(c) from the initial state illustrated in FIG. 9(a), and the cooling stage unit 60 retracts toward the inner portion side of the stage containing chamber 62. As a result, the positional relationship between the fin 58 and the containing chamber bottom 61c of the pot main body 61 is changed to approach each other, and the gap g1 between the fin 58 and the containing chamber bottom 61c of the gas pot 51 decreases. Further, when the gap g1 is not formed so that the fin 58 and the containing chamber bottom 61c of the gas pot 51 are brought into contact with each other, the vibration from the freezer 60 is transmitted to the gas pot 51, thereby causing vibration of the emitter tip 45 in the ion source housing 22.

The heat conducting medium adjusting mechanism 100 adjusts a variation of the cooling stage unit 60 based on such a pressure change of the heat conducting medium 69 such that the pressure of the heat conducting medium 69 becomes constant by adjusting the amount of the heat conducting medium 69 in each of the non-contact space 67 and the vibration suppressing space 68.

To be specific, when there is an indication that the bellows 63 is deformed to be stretchable and the cooling stage unit 60 is extruded outwardly inside the stage containing chamber 62 as illustrated in FIG. 9(b), the heat conducting medium adjusting mechanism 100 discharges the heat conducting medium 69 corresponding to the increased volume from the heat conducting medium discharge mechanism 102. On the other hand, when there is an indication that the bellows 63 is deformed to contract and the cooling stage unit 60 retracts to the inner portion side of the stage containing chamber 62 as illustrated in FIG. 9(c), the heat conducting medium adjusting mechanism 100 supplies the heat conducting medium 69 corresponding to the decreased volume from the heat conducting medium supply mechanism 101.

In this manner, the positional relationship with the containing chamber bottom 61c of the pot main body 61 is held in a given state as illustrated in FIG. 8 regardless of the temperature variation of the heat conducting medium 69 in the cooling mechanism 50 including the heat conducting medium adjusting mechanism 100, thereby achieving the further improvement in cooling performance of the cooling mechanism 50.

<Second Embodiment>

A description will be given regarding a scanning ion microscope 10' as an ion beam device according to a second embodiment of the present invention on the basis of FIGS. 10 to 13(b). Incidentally, each unit having the same or similar configuration as that in the scanning ion microscope 10 according to the first embodiment will be denoted by the same reference sign in the drawing when the description is given, and the redundant description will be omitted.

Figure 10:
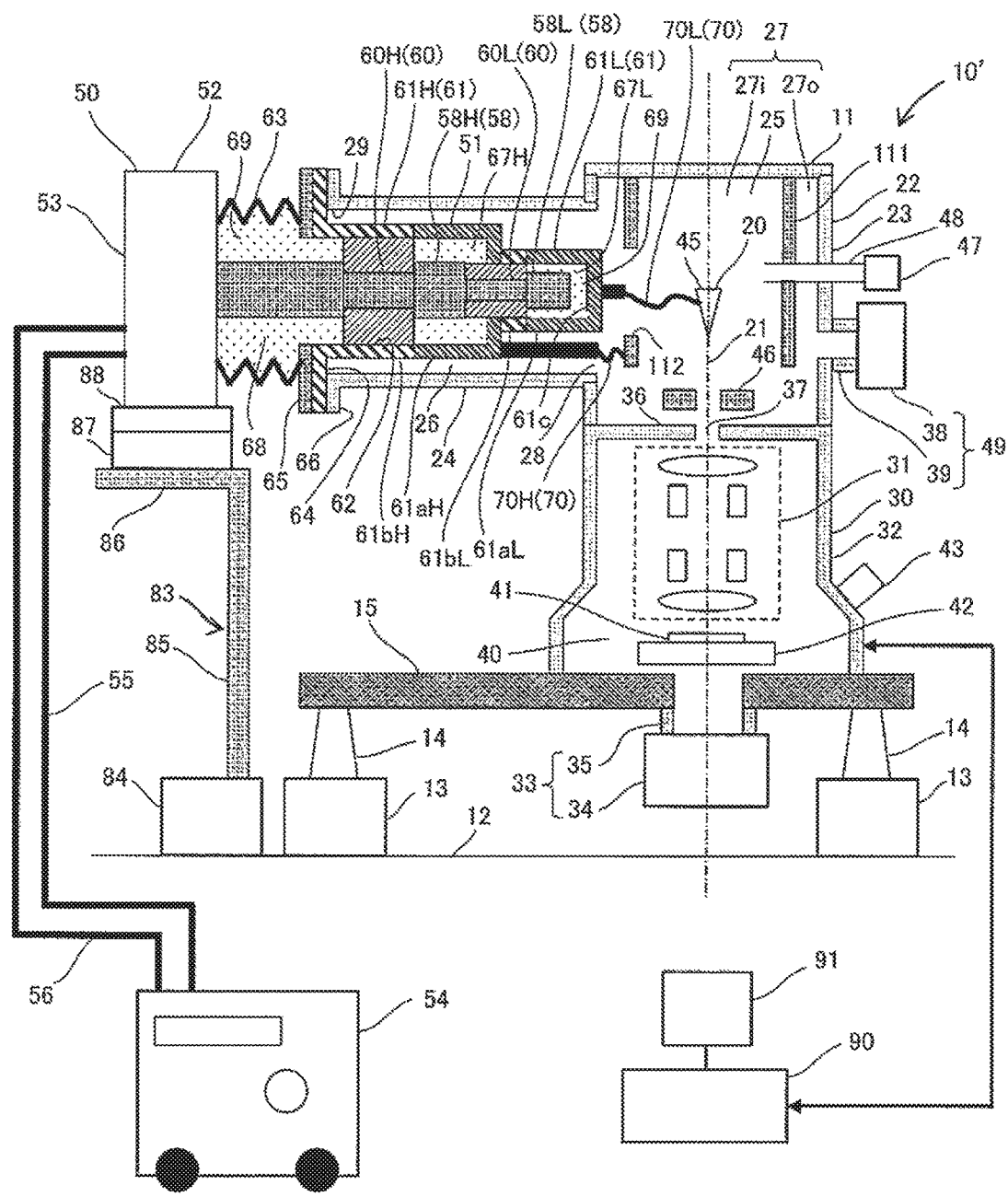
FIG. 10 is a schematic configuration diagram of a scanning ion microscope as an ion beam device according to a second embodiment of the present invention.

FIG. 10 is a schematic configuration diagram of the scanning ion microscope as the ion beam device according to the second embodiment of the present invention.

Figure 11:
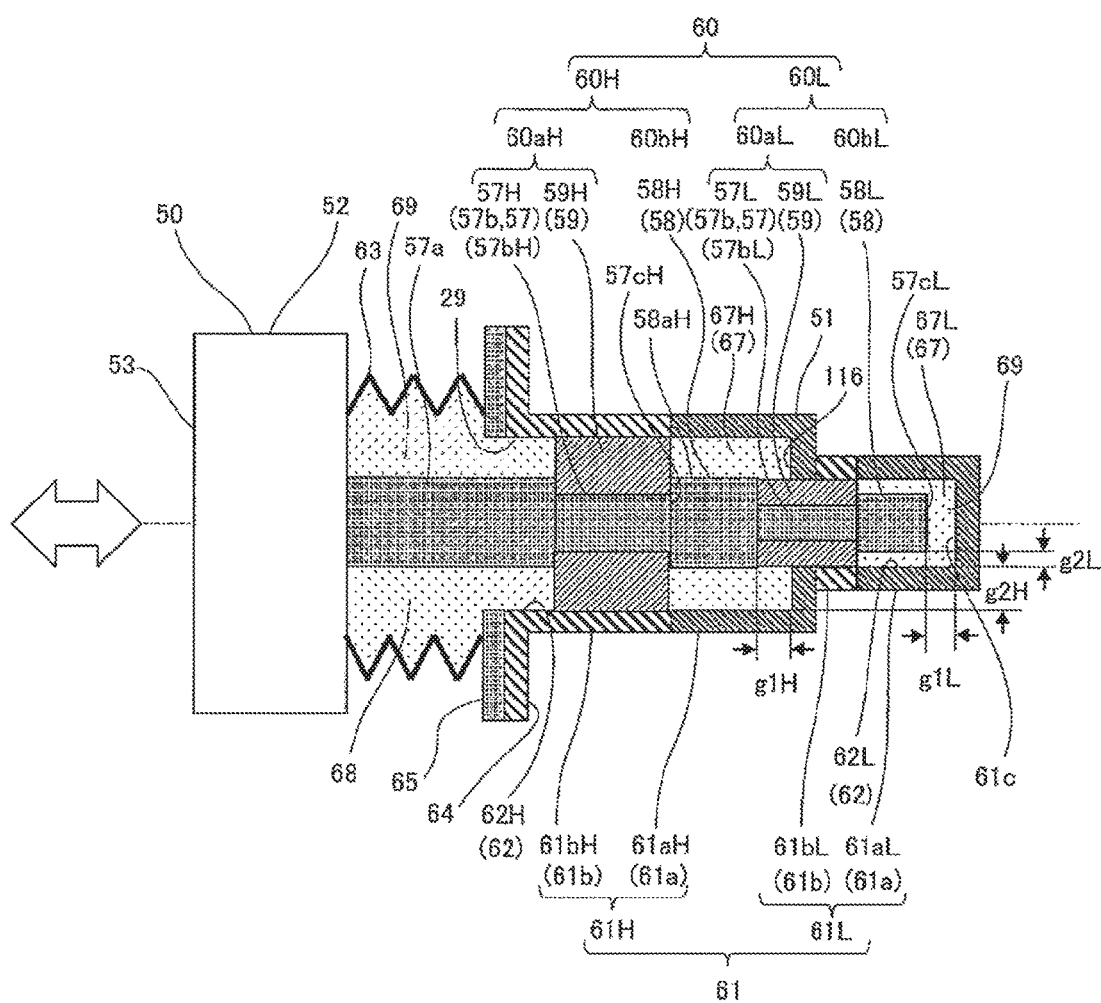
FIG. 11 is a partially enlarged view of a cooling stage unit and a gas pot section forming an ion beam device cooling mechanism of the ion beam device illustrated in FIG. 10.

FIG. 11 is a partially enlarged view of a cooling stage unit and a gas pot section forming an ion beam device cooling mechanism of the ion beam device illustrated in FIG. 10.

Figure 12:
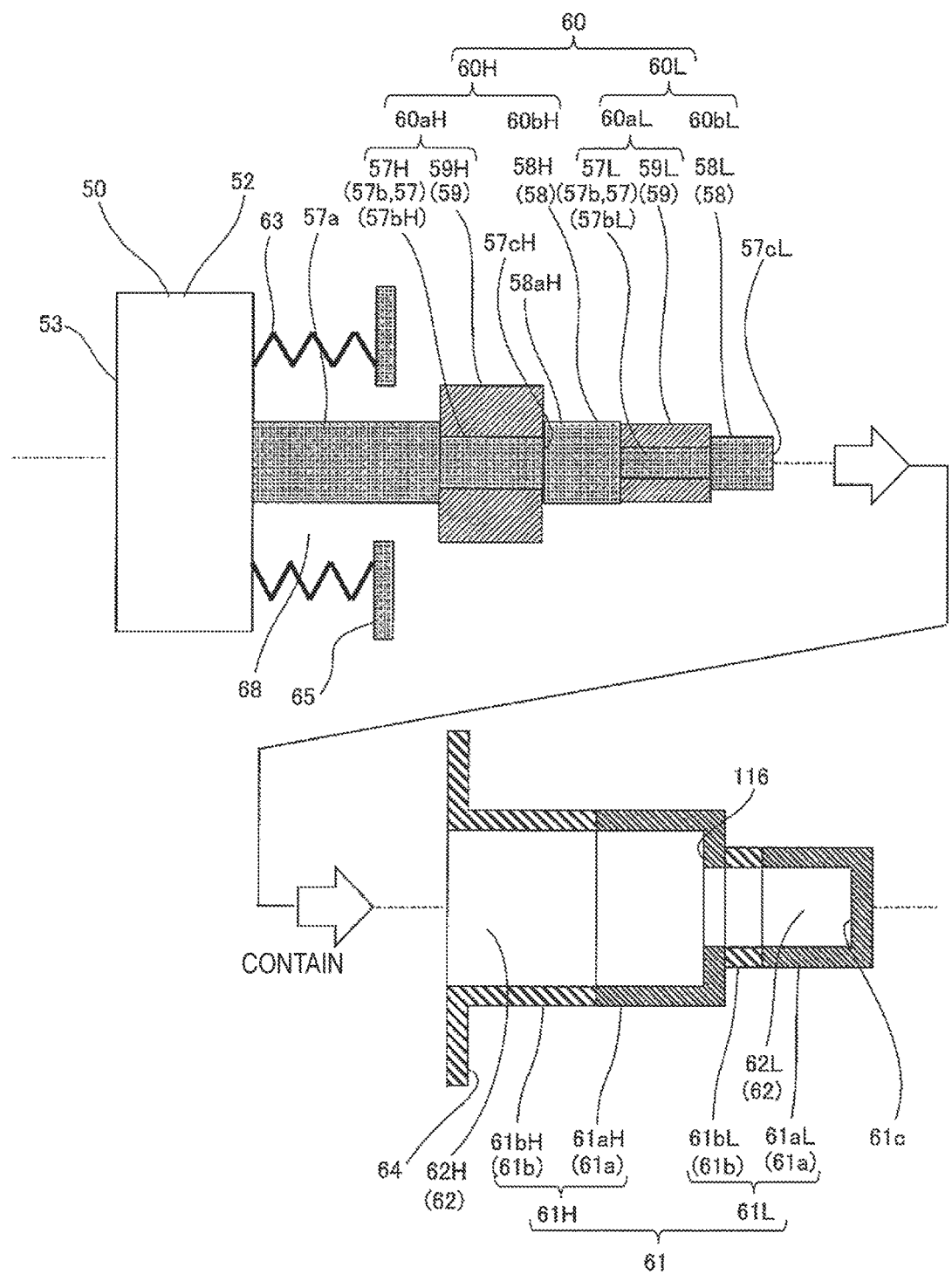
FIG. 12 is a diagram illustrating the cooling stage unit section and the gas pot section which are separated before being assembled as the cooling stage unit and gas pot section illustrated in FIG. 11.

FIG. 12 is a diagram illustrating the cooling stage unit section and the gas pot section which are separated before being assembled as the cooling stage unit and the gas pot section illustrated in FIG. 11.

FIGS. 13(a) and 13(b) are views for comparison between a normal temperature state and a cooling state in the cooling stage unit and the gas pot section illustrated in FIG. 11.

As illustrated in FIG. 10, the scanning ion microscope 10' according to the present embodiment is different from the scanning ion microscope 10 according to the first embodiment illustrated in FIG. 1 first in terms that the ion source chamber 27 of the ion source containing housing portion 23 is defined into an inner space 27i in which the emitter tip 45 is contained and an outer space 27o around the inner space 27i by a radiation shield 111, and the gas ionization chamber 25 is formed using the defined space 27i. Accordingly, downsizing of the gas ionization chamber 25, which is a target to be cooled by the cooling mechanism 50, is achieved in the scanning ion microscope 10' according to the present embodiment, as compared to the scanning ion microscope 10 illustrated in FIG. 1 in which the gas ionization chamber 25 becomes the inside of the ion source chamber 27.

In addition, the scanning ion microscope 10' according to the present embodiment is different from the scanning ion microscope 10 according to the first embodiment illustrated in FIG. 1 in terms that the freezer 52 in a two-stage cooling system including two large and small cylinders provided with the displacer, which is integrated with a built-in coldness accumulator and is reciprocatingly movable, for example, is used as the freezer 52 of the cooling mechanism 50, and the cooling stage unit 60 is configured to include a high-temperature-side cooling stage unit portion 60H to cool the radiation shield 111 to cryogenic temperature and a low-temperature-side cooling stage unit portion 60L to cool the emitter tip 45 to cryogenic temperature which is lower temperature than the radiation shield 111, along with the employing of the configuration in which the gas ionization chamber 25 is further defined by the radiation shield 111 inside the ion source chamber 27.

In the present embodiment, the radiation shield 111 is attached and fixed to the ion source housing 22 so as to open a releasing direction of the ion beam 21 and surrounds the emitter tip 45 inside the ion source containing housing portion 23 as illustrated in FIG. 10. The radiation shield 111 is configured using, for example, a gold-plated copper mesh or the like, and prevents entry of heat from outside into the gas ionization chamber 25. An open end of the gas supply piping 48 to supply an ionization gas passes through the space 27o and is opened at the space 27i so as to supply the ionization gas or gas molecules to the space 27i serving as the gas ionization chamber 25. In addition, a passage hole 112, configured to allow the cooling conduction mechanism 70, which transmits coldness generated by the cooling stage unit 60 of the cooling mechanism 50 to the emitter tip 45, to pass therethrough in a non-contact manner is formed in the radiation shield 111.

On the other hand, in the present embodiment, the cooling stage unit 60 has a structure such that the cooling stage unit 60 is formed by coaxially connecting the two high-temperature-side and low-temperature-side cooling stage unit portions 60H and 60L at two stages according to the use of the freezer 52 of the two-stage cooling system in the cooling mechanism 50, and the pot main body 61 of the gas pot 51 also has a structure obtained by continuously providing two high-temperature-side and low-temperature-side pot main body portions 61H and 61L to be coaxial with each other.

Figure 13:
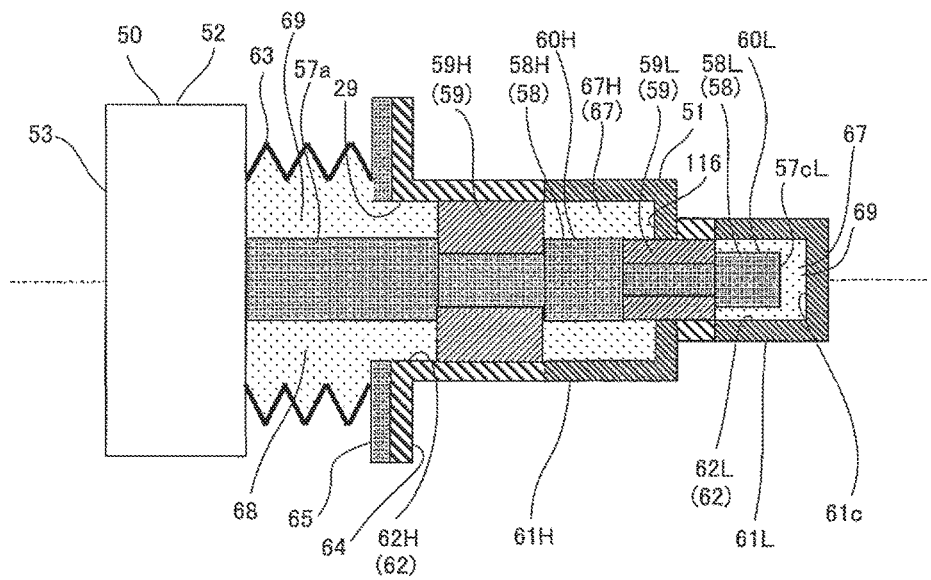
Figure 13:
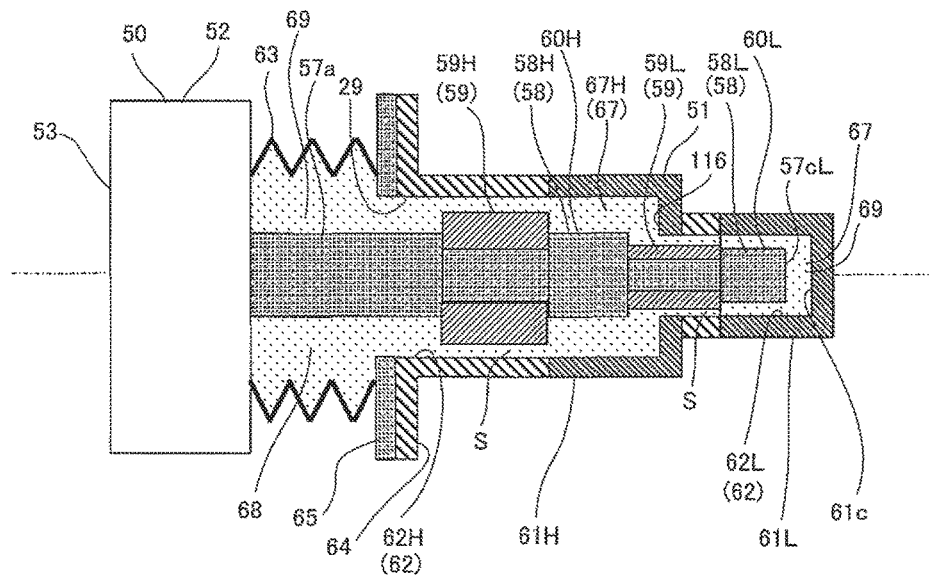

As illustrated in FIGS. 11 to 13(*b*), the cooling stage unit portions 60H and 60L are configured such that a size of the low-temperature-side cooling stage unit portion 60L on a distal end side, which has a storage 57*b*L including an expansion chamber side inside the small cylinder on the low temperature side is smaller than a size of the high-temperature-side cooling stage unit portion 60H on a proximal end side which has a stage 57*b*H including an expansion chamber side inside the large cylinder on the high temperature side. Further, the respective cooling stage unit portions 60H and 60L are configured such that the fin 58 (58H or 58L) has a larger outer shape viewed in the axial direction than the stage 57*b* (57*b*H or 57*b*L).

Furthermore, a spacer mounting portion 60*a*H, provided with a tubular spacer 59H that surrounds a peripheral surface of the stage 57*b*H in the entire region around the circumference of the stage 57*b*H, of the high-temperature-side cooling stage unit portion 60H is configured to have a larger outer shape vertical to the axis direction which is viewed in the axial direction than the fin portion 60*b*H, and an external peripheral edge of the spacer mounting portion 60*a*H projects outwardly in the radial direction more than an external peripheral edge of the fin portion 60*b*H in the entire region along the circumference thereof. Similarly, a spacer mounting portion 60*a*L, provided with a tubular spacer 59L that surrounds a peripheral surface of the stage 57*b*L in the entire region around the circumference of the stage 57*b*L, of the low-temperature-side cooling stage unit portion 60L is configured to have a larger outer shape vertical to the axis direction which is viewed in the axial direction than the fin portion 60*b*L, and an external peripheral edge of the spacer mounting portion 60*a*L projects outwardly in the radial direction more than an external peripheral edge of the fin portion 60*b*L in the entire region along the circumference thereof. Further, the fin portion 60*b*H of the high-temperature-side cooling stage unit portion 60H is configured to have the larger outer shape vertical to the axis direction which is viewed in the axial direction than the fin portion 60*b*L of the low-temperature-side cooling stage unit portion 60L, and the external peripheral edge of the fin portion 60*b*H projects outwardly in the radial direction more than the external peripheral edge of the fin portion 60*b*L in the entire region along the circumference thereof. The above-described spacers 59H and 59L are configured using a porous material, for example foamed resin.

Meanwhile, the pot main body 61 of the gas pot 51 obtained by continuously providing the two pot main body portions 61H and 61L on the high temperature side and the low temperature side to be coaxial has a stepped-cylindrical shape with a bottom whose one end is blocked and the other end is opened, and has a configuration in which the pot main body portion 61H containing the high-temperature-side cooling stage unit portion 60H on the one end side and the pot main body portion 61L containing the low-temperature-side cooling stage unit portion 60L on the other end side are integrated via a stepped portion 116. Further, a high-temperature-side stage containing chamber 62H is formed in the pot main body portion 61H.

A cross-sectional shape of the high-temperature-side stage containing chamber 62H vertical to the axis is a cross-sectional shape which has no step and is uniform in the entire region along the axial direction, and is a cross-sectional shape formed in accordance with an external peripheral surface shape of the spacer mounting portion 60*a*H of the high-temperature-side cooling stage unit portion 60H. A size of this cross-sectional shape (length of the high-temperature-side stage containing chamber 62H in the radial direction) is set to be a size that enables contact with the spacer mounting portion 60*a*H of the high-temperature-side cooling stage unit portion 60H in a normal temperature state, that is, the external peripheral edge of the spacer 59H in a non-contracted state in the cooling stage unit 60. In addition, a length of the high-temperature-side stage containing chamber 62H in the axial direction is set to be appropriately longer than a length obtained by adding a length of the spacer mounting portion 60*a*H in the axial direction and a length of the fin portion 60*b*H in the axial direction in the high-temperature-side cooling stage unit portion 60H.

The low-temperature-side stage containing chamber 62L is formed to be coaxial with the high-temperature-side stage containing chamber 62H, and communicates with the high-temperature-side stage containing chamber 62H. A cross-sectional shape of the low-temperature-side stage containing chamber 62L vertical to the axis is a cross-sectional shape which has no step and is uniform in the entire region along the axial direction, and is a cross-sectional shape formed in accordance with an external peripheral surface shape of the spacer mounting portion 60*a*L of the low-temperature-side cooling stage unit portion 60L. A size of this cross-sectional shape (length of the low-temperature-side stage containing chamber 62L in the radial direction) is set to be a size that enables contact with the spacer mounting portion 60*a*L of the low-temperature-side cooling stage unit portion 60L in a normal temperature state, that is, the external peripheral edge of the low-temperature-side spacer 59L in a non-contracted state. In addition, a length of the low-temperature-side stage containing chamber 62L in the axial direction is set to be appropriately longer than a length of the fin portion 60*b*L of the low-temperature-side cooling stage unit portion 60L in the axial direction.

Furthermore, a length of the stage containing chamber 62, which is formed in the pot main body portion 61 and includes the high-temperature-side stage containing chamber 62H and the low-temperature-side stage containing chamber 62L, in the axial direction is set to be appropriately longer than a length obtained by adding the length of the high-temperature-side cooling stage unit portion 60H in the axial direction and the length of the low-temperature-side cooling stage unit portion 60L in the axial direction.

Further, each of the pot main body portions 61H and 61L is configured by joining and fixing the opening-side main body portion 61*b* (61*b*H or 61*b*H) formed using a heat insulating material and the bottom-side main body portion 61*a* (61*a*H or 61*a*H) formed using the heat conducting material to be coaxially integrated with each other along the axial direction.

Accordingly, the high-temperature-side non-contact space 67H is formed between the fin portion 60*b*H of the high-temperature-side cooling stage unit portion 60H and the bottom (cross section)-side main body portion 61*a*H of the pot main body portion 61H. In addition, the low-temperature-side non-contact space 67L is formed between the fin portion 60bL of the low-temperature-side cooling stage unit portion 60L and the bottom-side main body portion 61aL of the pot main body portion 61L. Further, the heat conducting medium 69 is stored in each of the high-temperature-side non-contact space 67H and the low-temperature-side non-contact space 67L. Further, in the gas pot 51, the bottom-side main body portion 61aH of the high-temperature-side pot main body portion 61H of the pot main body 61 is cooled by coldness of the fin portion 60bH of the high-temperature-side cooling stage unit portion 60H to the cryogenic temperature, and the bottom-side main body portion 61aL of the low-temperature-side pot main body portion 61L of the pot main body 61 is cooled by coldness of the fin portion 60bL of the low-temperature-side cooling stage unit portion 60L to still lower cryogenic temperature.

Further, the bottom-side main body portion 61aH of the high-temperature-side pot main body portion 61H of the pot main body 61 formed using the heat conducting material is thermally connected to the radiation shield 111 provided in the ion source containing housing portion 23 of the ion source housing 22 via the high-temperature-side cooling conduction mechanism 70H configured to include a gold-plated copper mesh portion, for example. In addition, the bottom-side main body portion 61aL of the low-temperature-side pot main body portion 61L of the pot main body 61 formed using the heat conducting material is thermally connected to the emitter tip 45 provided in the ion source containing housing portion 23 of the ion source housing 22 via a low-temperature-side cooling conduction mechanism 70L.

Even in the scanning ion microscope 10' according to the present embodiment, the same action and effects as those in the scanning ion microscope 10 according to the first embodiment are achieved regarding the assembly of the cooling mechanism 50, position adjustment between the fin 58 and the gas pot 51 performed by the spacer 59 at the time of assembly relating to the cooling mechanism 50, and the cooling performance of the scanning ion microscope 10'.

For example, it is preferable to set an end face gap g1H between the fin 58H and the stepped portion 116 of the pot main body 61 and an end face gap g1L between the fin 58L and the containing chamber bottom 61c of the pot main body 61 in a vibration direction to be large from a viewpoint of preventing the vibration transmitted from the freezer main body 53, and particularly, the vibration generated as the displacer repeats reciprocation at high speed inside the cylinder from being transmitted to the gas pot 51. When the end face gaps g1H and g1L are set to be large, however, each cooling performance of the fins 58H and 58L with respect to the stepped portion 116 and the containing chamber bottom 61c of the pot main body 61 decreases. Thus, it is preferable to set a side surface gap g2H or g2L between the fin 58H or 58L and the internal peripheral surface of the pot main body 61 as narrow as possible in order to complement the decreases in cooling performance of the fins 58H and 58L with respect to the stepped portion 116 and the containing chamber bottom 61c of the pot main body 61 to improve the cooling efficiency. In regard to this point, it is possible to roughly set the positional relationship between the external peripheral edge of the fin 58H or 58L and the internal peripheral surface of the pot main body 61 in response to the size of the clearance S specified by the spacer 59H or 59L in the present embodiment, and thus, it is possible to easily and accurately narrow the side surface gap g2H or g2L.

Incidentally, the description has been given in the illustrated example regarding the case of using the same material for the two spacers 59H and 59L, but the material of the spacer 59 may be changed between the high-temperature-side spacer 59H and the low-temperature-side spacer 59L. In addition, for example, a specific form of the spacer 59, such as the tubular spacer and a spacer piece assembly, or a shape of the external peripheral edge viewed in the axis direction, such as a circular shape and a polygonal shape, may be changed between the high-temperature-side spacer 59H and the low-temperature-side spacer 59L.

Figure 14:
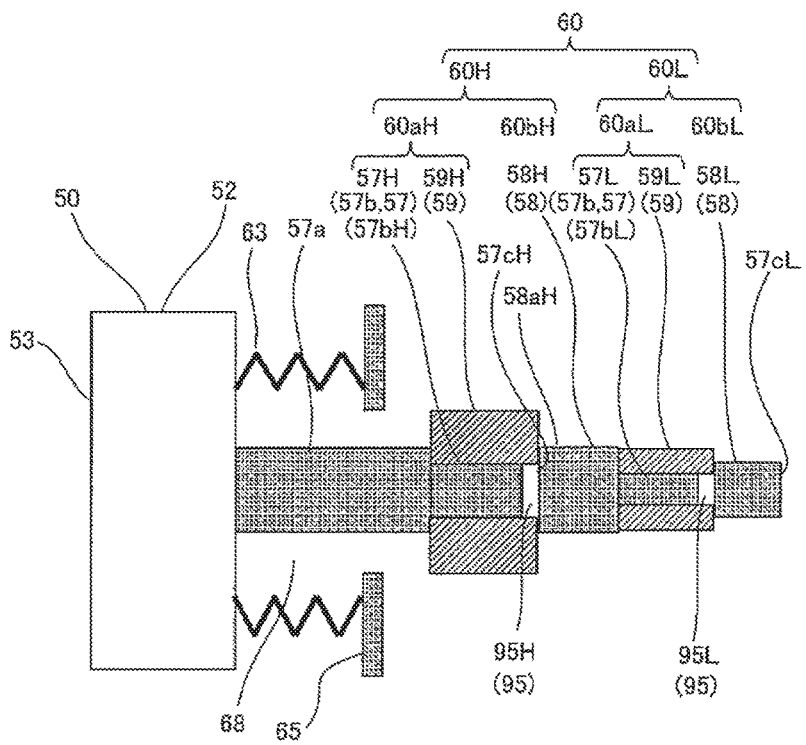
FIGS. 14(a) and 14(b) are configuration diagrams of a modified example of an assembly obtained by connecting and fixing a fin to a cooling stage.
Figure 14:
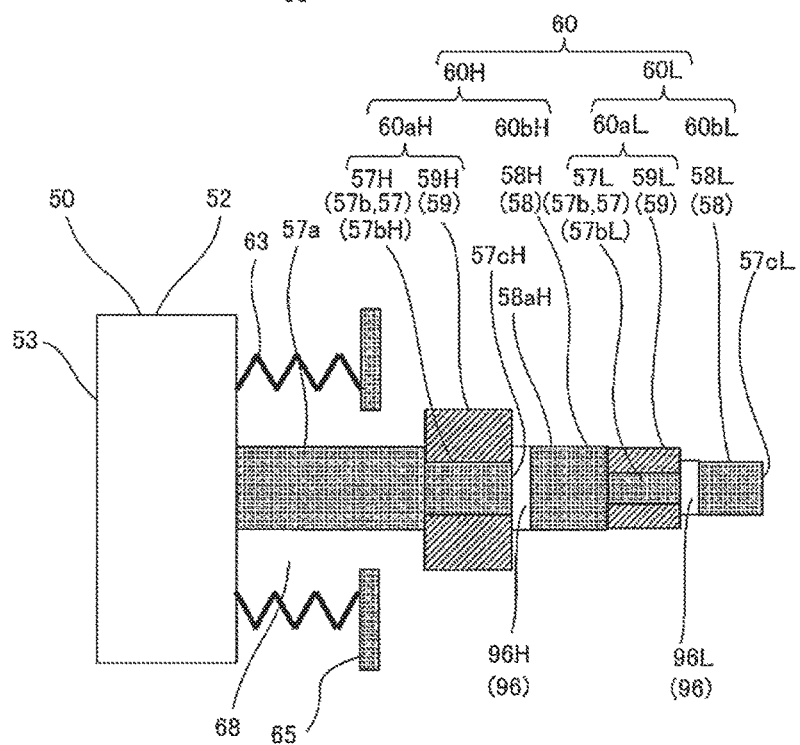

FIGS. 14(a) and 14(b) are configuration diagrams of a modified example of an assembly obtained by connecting and fixing a fin to a cooling stage. Incidentally, when a configuration of the assembly is described, the same components as those of the assembly illustrated in FIGS. 7(a), 7(b) and 12 will be denoted by the same reference signs, and the detailed description thereof will be omitted.

The cooling stage unit 60 illustrated in FIG. 14(a) is configured such that the thermally conductive sheet 95 (95H or 95L) made of a soft material and has favorable heat conduction, such as indium, is interposed and sandwiched between the stage 57b (57bH or 57bL) and the fin 58 (58H or 58L) in advance before joining and fixing both the stage 57b and the fin 58. Accordingly, the thermally conductive sheet 95 is deformed to bury the uneven surfaces generated in the respective joining and fixing surfaces at the time of joining and fixing the fin 58 to the stage 57b, thereby improving the efficiency of heat conduction between both the joining and fixing surfaces.

On the contrary, a thermally conductive film 96 (96H or 96L) made of a soft material which is soft and has favorable heat conduction, such as gold plating, is formed on a surface of the fin 58 (58H or 58L) to be joined and fixed to the stage 57b (57bH or 57bL) in the cooling stage unit 60 illustrated in FIG. 14(b). Accordingly, the thermally conductive film 96 is deformed to bury the uneven surfaces generated in the respective joining and fixing surfaces at the time of joining and fixing the fin 58 to the cooling stage 57, thereby improving the efficiency of heat conduction between both the joining and fixing surfaces.

<Third Embodiment>

An ion beam device according to the present embodiment will be described regarding the ion beam device obtained by combining the ion beam device and the device other than the ion beam device by exemplifying an ion beam device in which a mass spectrometer 121 as an optional item, for example, is attached to the vacuum chamber 32 of the scanning ion microscope 10 according to the first embodiment illustrated in FIGS. 1 to 4 on the basis of the drawings. Incidentally, the overlapping description with that for the scanning ion microscope 10 illustrated in FIGS. 1 to 4 will be omitted in the following description.

Figure 15:
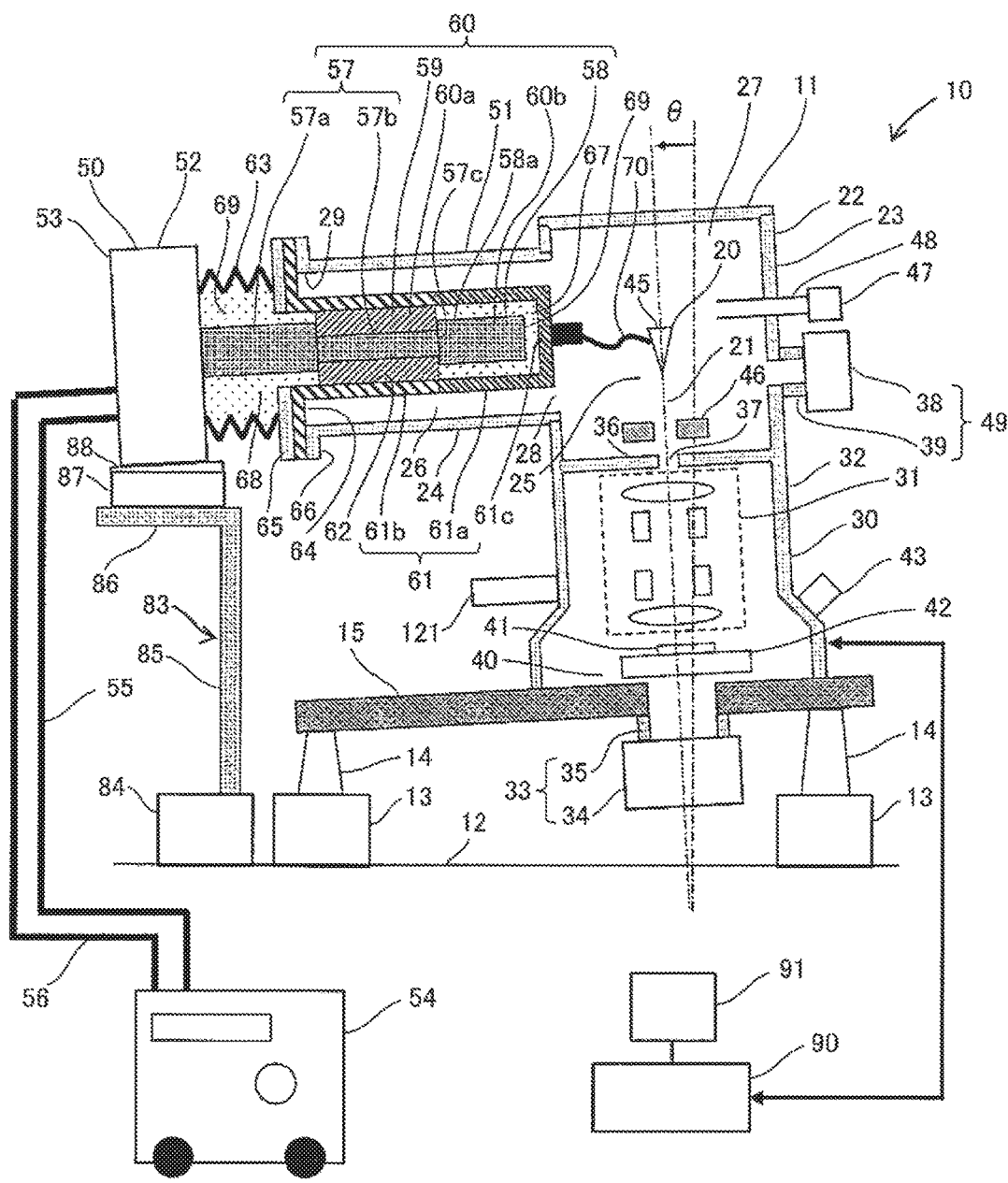
FIG. 15 is a configuration diagram of an example of an ion beam device in which a scanning ion microscope and a mass spectrometer are combined.

FIG. 15 is a configuration diagram of an example of the ion beam device in which the scanning ion microscope and the mass spectrometer are combined.

As illustrated in FIG. 15, in the ion beam device in which the mass spectrometer 121 as the optional item, for example, is attached to the vacuum chamber 32 of the scanning ion microscope 10 illustrated in FIG. 1, the device main body 11 of the scanning ion microscope 10 mounted and fixed to the base stand 13 is inclined by the inclination angle θ as a position of the center of gravity of the device main body 11 of the scanning ion microscope 10 is changed from a position of the center of gravity in the standard configuration in which the mass spectrometer 121 is not provided.

Even in such a case, the scanning ion microscope 10 forming the ion beam device is provided with the position adjusting and fixing mechanism 87 capable of finely adjusting an attitude state of the freezer main body 53 mounted and fixed to the mounting portion 88 within a tolerable range, and thus, it is possible to adjust a mounting attitude of the freezer main body 53 on the support stand 83 such that a direction of the cooling stage unit 60 of the freezer 52 becomes coaxial with a containing direction of the gas pot 51 by adjusting an attachment angle of the mounting portion 88 in response to a change of the containing direction of the gas pot 51 (direction of the cooling mechanism mounting port 29) in the pot containing housing portion 24 of the ion source housing 22 caused by the inclination of the device main body 11.

Accordingly, if the device main body of the ion beam device is inclined, the same action and effects as those in the scanning ion microscope 10 illustrated in FIG. 1 are achieved regarding the assembly of the cooling mechanism 50, position adjustment between the fin 58 and the gas pot 51 performed by the spacer 59 at the time of assembly, and the cooling performance of the scanning ion microscope 10.

Figure 16:
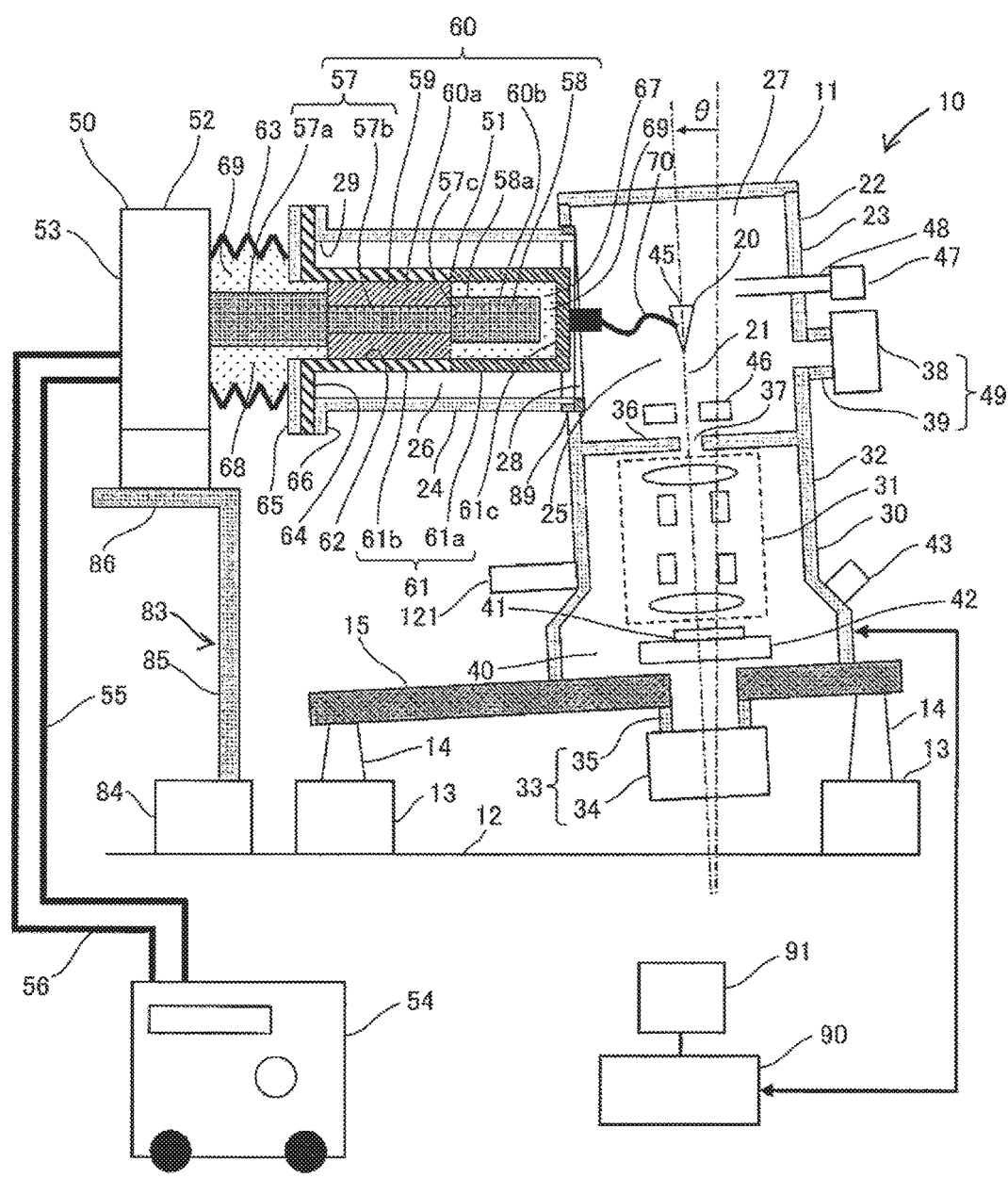
FIG. 16 is a configuration diagram of another example relating to the ion beam device in which the scanning ion microscope and the mass spectrometer are combined illustrated in FIG. 15.

FIG. 16 is a configuration diagram of another example relating to the ion beam device in which the scanning ion microscope and the mass spectrometer are combined illustrated in FIG. 15.

In the present example, a containing direction adjusting and fixing mechanism 89 is provided, which is capable of finely adjusting the containing direction of the gas pot 51 (direction of the cooling mechanism mounting port 29) in the pot containing housing portion 24 of the ion source housing 22 within the tolerable range with respect to the ion source containing housing portion 23 in a connection portion between the ion source containing housing portion 23 and the pot containing housing portion 24 in the ion source housing 22 of the scanning ion microscope 10.

Even in the present example, even if the device main body of the ion beam device is inclined, the same action and effects as those in the scanning ion microscope 10 illustrated in FIG. 1 are achieved regarding the assembly of the cooling mechanism 50, position adjustment between the fin 58 and the gas pot 51 performed by the spacer 59 at the time of assembly, and the cooling performance of the scanning ion microscope 10.

In addition, the cooling conduction mechanism 70 is configured using a gold-plated copper mesh, and can be deformed, for example, deflected or bent, by deformation of the copper mesh portion in the present example. Thus, even if the containing direction of the gas pot 51 is changed with respect to the ion source containing housing portion 23, the cooling conduction mechanism 70 can be deformed, for example, deflected or bent, in response to the change. Accordingly, even when the cooling conduction mechanism 70 is cut or the like, the transmission of coldness is not blocked.

Incidentally, embodiments of the present invention are not limited only to the specific configurations of the embodiments described above. For example, in the case of the spacer piece assembly in which the plurality of spacer pieces are arranged side by side with the predetermined interval along the circumferential direction of the stage 57*b* to partially surround the peripheral surface of the stage 57*b*, the spacer pieces can be also provided on the internal peripheral surface of the gas pot 51.

In addition, it is unnecessary to implement the respective examples described above independently from each other, but a plurality of examples can be applied at the same time without restricting the scope of the claims.

REFERENCE SIGNS LIST

10 scanning ion microscope
11 device main body
12 floor
13 base stand
14 anti-vibration mechanism
15 base plate
20 ion source (gas ion source)
21 ion beam
22 ion source housing
23 ion source containing housing portion
24 pot containing housing portion (cooling mechanism housing portion)
25 gas ionization chamber
26 pot containing chamber
27 ion source chamber
28 communication port
29 cooling mechanism mounting port
30 column (lens barrel)
31 beam irradiation system
32 vacuum chamber
33 vacuum exhaust system
34 vacuum exhaust equipment
35 vacuum exhaust pipe
36 bulkhead
37 passage hole
38 vacuum exhaust equipment
39 vacuum exhaust pipe
40 sample chamber
41 sample
42 sample stage
43 secondary particle detector
45 emitter tip
46 extraction electrode
47 gas source
48 gas supply piping
49 vacuum exhaust system
50 ion beam device cooling mechanism (cooling mechanism)
52 freezer
53 freezer main body
54 compressor
55 high-pressure piping
56 low-pressure piping
57 cooling stage
57*a* base
57*b* stage
57*c* stage distal end
58 fin
58*a* base
59 spacer
60 cooling stage unit
60*a* spacer mounting portion
60*b* fin portion
61 pot main body
61*a* bottom-side main body portion
61*b* opening-side main body portion
61*c* containing chamber bottom
62 stage containing chamber
63 bellows
64 attachment flange
65 pot connecting frame
66 attachment flange 67 non-contact space
68 vibration suppressing space
69 heat conducting medium
70 cooling conduction mechanism
83 support stand
84 base stand
85 fulcrum
86 attachment plate
87 position adjusting and fixing mechanism
88 mounting portion
89 containing direction adjusting and fixing mechanism
90 control device
91 input/output device
95 thermally conductive sheet
96 thermally conductive film
100 heat conducting medium adjusting mechanism
101 heat conducting medium supply mechanism
102 heat conducting medium discharge mechanism
103 heat conducting medium source
104 regulator
105 heat conducting medium port
106 check valve
107 pressure gauge
108 heat conducting outlet
111 radiation shield
112 passage hole
116 stepped portion
121 mass spectrometer All publications, patents, and patent applications cited herein are incorporated herein by reference in their entirety.

The invention claimed is:

1. An ion beam device comprising:
an ion source housing that is provided with an emitter tip to generate an ion and defines an ion source chamber supplied with an ionization gas or gas molecules;
a cooling pot that is provided in the ion source chamber so as to be thermally connected to the emitter tip and contains a cooling stage of a freezer so as to have no direct physical contact therebetween, the cooling stage comprising a stepped rod having first and second connected sections, said second section having a smaller outer shape than an outer shape of said first section; and
a spacer disposed between said second section and an inner peripheral surface of the cooling pot so as to surround said second section to maintain a non-contact space defined by a gap interval or greater between a peripheral surface of the cooling stage and the internal peripheral surface of the cooling pot,
wherein the spacer is arranged on a peripheral surface of the cooling stage.

2. The ion beam device according to claim 1, wherein the spacer is configured such that an external peripheral edge shape thereof viewed in a containing direction of the cooling pot contracts to be deformed in a cooling state with respect to a normal temperature state.

3. The ion beam device according to claim 1, wherein the spacer is configured using a material whose volume shrinks in the cooling state with respect to the normal temperature state.

4. The ion beam device according to claim 3, wherein the material is a porous material.

5. The ion beam device according to claim 1, wherein a fin is provided in the cooling stage so as to have no direct physical contact with the cooling pot, and
the pot is cooled using a heat conducting medium present around the fin.

6. The ion beam device according to claim 5, wherein the pot has a heat conducting portion and a heat insulating portion and is configured by joining both the portions in a containing direction of the cooling stage such that the heat conducting portion is positioned at an inner potion of the ion source chamber with respect to the heat insulating portion, and
the heat conducting portion is arranged in the ion source chamber to face the emitter tip without being exposed from the ion source chamber.

7. The ion beam device according to claim 6, wherein a portion of the cooling pot opposing the fin is formed using the heat conducting portion.

8. The ion beam device according to claim 5, wherein an interval between the fin and an internal peripheral surface of the pot which is vertical to a vibration direction of the cooling stage is larger than an interval between the fin and an internal peripheral surface of the pot which is parallel to the vibration direction of the cooling stage.

9. The ion beam device according to claim 6, wherein a soft film or a soft sheet member formed using a material with high thermal conductivity is interposed in a joint between the cooling stage and the fin so as to achieve smoothing of at least one of joining surfaces of the cooling stage and the fin.

10. The ion beam device according to claim 9, wherein the soft film is a gold-plated film, and the soft sheet member is a thermally conductive sheet.

11. The ion beam device according to claim 1, further comprising
an adjusting mechanism that adjusts an angle of the freezer with respect to a ground surface or an angle between the ion source chamber portion of the ion source housing in which the pot is contained and the ion source chamber portion in which the emitter tip is contained, in accordance with an inclination angle of the ion source housing.

12. The ion beam device according to claim 1, wherein the pot is provided with a heat conducting medium supply mechanism to supply the heat conducting medium into the pot and a heat conductor discharge mechanism to discharge the heat conducting medium from an inside of the pot.

13. The ion beam device according to claim 1, wherein the cooling stage and the spacer are provided in plural.

14. A freezer that is used in an ion beam device, which includes an emitter tip to generate an ion in an ion source chamber defined by an ion source housing and supplied with an ionization gas or gas molecules, to cool the emitter tip, the freezer comprising:
a cooling stage that is contained in a cooling pot, provided in the ion source chamber and is thermally connected to the emitter tip, so as to have no direct physical contact therebetween, and cools the cooling pot using a heat conducting medium, the cooling stage comprising a stepped rod having first and second connected sections, said second section having a smaller outer shape than an outer shape of said first section; and
a spacer disposed between said second section and an inner peripheral surface of the cooling pot so as to surround said second section to maintain a non-contact space defined by a gap interval or greater between a peripheral surface of the cooling stage and the internal peripheral surface of the cooling pot,
wherein the spacer is arranged on a peripheral surface of the cooling stage.

15. The freezer according to claim 14, wherein
the spacer is configured using a material whose volume shrinks in a cooling state with respect to a normal temperature state.

16. The freezer according to claim 15, wherein
the material is a porous material.

17. The freezer according to claim 14, wherein
a fin is provided in the cooling stage so as to have no direct physical contact with the cooling pot, and
the pot is cooled using the heat conducting medium present around the fin.

18. The freezer according to claim 14, wherein
the cooling stage and the spacer are provided in plural.

19. A mounting method of a cooling mechanism that is used in an ion beam device, which includes an emitter tip to generate an ion in an ion source chamber defined by an ion source housing and supplied with an ionization gas or gas molecules, to cool the emitter tip, the method comprising:

containing a cooling stage to cool a cooling pot in the cooling pot which is provided in the ion source chamber so as to be thermally connected to the emitter tip maintaining a spacer in a normal temperature state, the spacer configured using a material whose volume shrinks in a cooling state with respect to the normal temperature state, the cooling stage comprising a stepped rod having first and second connected sections, said second section having a smaller outer shape than an outer shape of said first section; and causing the spacer to be in the cooling state in a state of being contained in the cooling pot so as to separate a peripheral surface of the spacer and an internal peripheral surface of the cooling pot, wherein the spacer is disposed between said second section and the inner peripheral surface of the cooling pot so as to surround said second section to maintain a non-contact space defined by a gap interval or greater between a peripheral surface of the cooling stage and the internal peripheral surface of the cooling pot, and wherein the spacer is arranged on a peripheral surface of the cooling stage.

* * * * *